US010474045B2

United States Patent
Bijnen et al.

(10) Patent No.: US 10,474,045 B2
(45) Date of Patent: Nov. 12, 2019

(54) LITHOGRAPHIC APPARATUS AND DEVICE MANUFACTURING METHOD

(71) Applicant: ASML NETHERLANDS B.V., Veldhoven (NL)

(72) Inventors: Franciscus Godefridus Casper Bijnen, Valkenswaard (NL); Arie Jeffrey Den Boef, Waalre (NL); Richard Johannes Franciscus Van Haren, Waalre (NL); Patricius Aloysius Jacobus Tinnemans, Hapert (NL); Alexander Ypma, Veldhoven (NL); Irina Anatolievna Lyulina, Son (NL); Edo Maria Hulsebos, Waalre (NL); Hakki Ergün Cekli, Singapore (SG); Xing Lan Liu, Ukkel (BE); Loek Johannes Petrus Verhees, Reusel (NL); Victor Emanuel Calado, Rotterdam (NL); Leon Paul Van Dijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/737,990

(22) PCT Filed: Jun. 28, 2016

(86) PCT No.: PCT/EP2016/065027
§ 371 (c)(1),
(2) Date: Dec. 19, 2017

(87) PCT Pub. No.: WO2017/009036
PCT Pub. Date: Jan. 19, 2017

(65) Prior Publication Data
US 2018/0348654 A1    Dec. 6, 2018

(30) Foreign Application Priority Data

Jul. 13, 2015   (EP) .................................. 15176521
Jun. 22, 2016  (EP) .................................. 16175702

(51) Int. Cl.
G03F 9/00       (2006.01)
G03F 7/20       (2006.01)

(52) U.S. Cl.
CPC ........ G03F 9/7092 (2013.01); G03F 7/70141 (2013.01); G03F 7/70508 (2013.01);
(Continued)

(58) Field of Classification Search
CPC .... G03F 9/70; G03F 9/70508; G03F 9/70633; G03F 9/7046
See application file for complete search history.

(56) References Cited

U.S. PATENT DOCUMENTS 7,198,964 B1   4/2007   Cherry et al.
9,046,385 B2   6/2015   Bijnen et al.
(Continued)

FOREIGN PATENT DOCUMENTS

CN    1445819    10/2003
CN    1577080    2/2005
(Continued)

OTHER PUBLICATIONS

International Search Report and Written Opinion dated Nov. 10, 2016 in corresponding International Patent Application No. PCT/EP2016/065027.
(Continued)

Primary Examiner — Maurice C Smith
(74) Attorney, Agent, or Firm — Pillsbury Winthrop Shaw Pittman LLP

(57) ABSTRACT

A method of characterizing a deformation of a plurality of substrates is described. The method includes: measuring, for
(Continued)

a plurality of n different alignment measurement parameters λ and for a plurality of substrates, a position of the alignment marks; determining a positional deviation as the difference between the n alignment mark position measurements and a nominal alignment mark position; grouping the positional deviations into data sets; determining an average data set; subtracting the average data set from the data sets to obtain a plurality of variable data sets; performing a blind source separation method on the variable data sets, thereby decomposing the variable data sets into a set of eigenwafers representing principal components of the variable data sets; and subdividing the set of eigenwafers into a set of mark deformation eigenwafers and a set of substrate deformation eigenwafers.

20 Claims, 8 Drawing Sheets

(52) U.S. Cl.
CPC ........ *G03F 7/70633* (2013.01); *G03F 9/7046* (2013.01); *G03F 9/7088* (2013.01)

(56) References Cited

U.S. PATENT DOCUMENTS

| | | | |
|---|---|---|---|
| 9,360,769 | B2 | 6/2016 | Kisteman et al. |
| 2005/0031969 | A1 | 2/2005 | Finders et al. |
| 2010/0321654 | A1 | 12/2010 | Den Boef |
| 2011/0085726 | A1* | 4/2011 | Den Boef ............. G03F 9/7065 382/151 |
| 2012/0123581 | A1 | 5/2012 | Smilde et al. |
| 2013/0148121 | A1* | 6/2013 | Den Boef ........... G03F 7/70633 356/401 |
| 2013/0308142 | A1* | 11/2013 | Straaijer ................ G01B 11/24 356/625 |
| 2014/0185024 | A1 | 7/2014 | Zellner et al. |
| 2015/0146188 | A1* | 5/2015 | Lyulina ............... G03F 7/70633 355/77 |

FOREIGN PATENT DOCUMENTS

| | | |
|---|---|---|
| CN | 102156392 | 8/2011 |
| JP | 2012530366 | 11/2012 |
| JP | 2014502420 | 1/2014 |
| JP | 2014512101 | 5/2014 |
| JP | 2014168031 | 9/2014 |
| TW | 200305292 | 10/2003 |
| TW | 201316135 | 4/2013 |
| WO | 2014146906 | 9/2014 |
| WO | 2015/049087 | 4/2015 |

OTHER PUBLICATIONS

Lam, Auguste et al., "Pattern recognition and data mining techniques to identify factors in wafer processing and control determining overlay error", Proceedings of SPIE, vol. 9424, Mar. 19, 2015, pp. 94241L-1-94241L-10.

Lee, Hong-Coo et al., "Reduction of in-lot overlay variation with integrated metrology, and a holistic control strategy", Proceedings of SPIE, vol. 9635, Oct. 23, 2015, pp. 96351S-1-96351S-7.

Cherry, Gregory A. et al. "Multiblock Principal Component Analysis Based on a Combined Index for Semiconductor Fault Detection and Diagnosis", IEEE Transactions on Semiconductor Manufacturing, vol. 19, No. 2, pp. 159-172 (2006).

Japanese Office Action issued in corresponding Japanese Patent Application No. 2018-501863, dated Mar. 12, 2019.

International Preliminary Report on Patentability dated Jan. 16, 2018 in corresponding International Patent Application No. PCT/EP2016/065027.

Chinese Office Action issued in corresponding Chinese Patent Application No. 2016800417233, dated Jul. 12, 2019.

\* cited by examiner (a)

(b)

(c)

(a)

(b)

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/065027, which was filed on Jun. 28, 2016, which claims the benefit of priority of European patent application no. 15176521.1, which was filed on Jul. 13, 2015, and European patent application no. 16175702.6, which was filed on Jun. 22, 2016, each of which are incorporated herein in its entirety by reference.

BACKGROUND

Field of the Invention

The present invention relates to a method of characterizing a deformation of a plurality of substrates, an alignment method for a substrate, an alignment system, a lithographic apparatus, an overlay measurement method, a metrology system and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, the integrated circuits as manufactured include a plurality of layers containing different patterns, each layer being generated using an exposure process as described above. In order to ensure proper operation of the integrated circuit that is manufactured, the layers as consecutively exposed need to be properly aligned to each other. In order to realize this, substrates are typically provided with a plurality of so-called alignment marks (also referred to as alignment targets), whereby a position of the alignment marks is used to determine or estimate a position of a previously exposed pattern, said position also being referred to as the target portion as it is the target position for a subsequent pattern that is to be exposed in line or aligned with the previously exposed pattern. As such, prior to the exposure of a subsequent layer, the position of alignment marks is determined and used to determine a position of the pattern that was previously exposed. Typically, in order to determine the positions of such alignment marks, an alignment sensor is applied which may e.g. be configured to project a radiation beam onto an alignment mark or target and determine, based on a reflected radiation beam, a position of the alignment mark. Ideally, the measured position of the alignment mark would correspond to the actual position of the alignment mark. However, various causes may result in a deviation between the measured position and the actual position of the alignment mark. In particular, a deformation of the alignment mark, e.g. caused by the processing of the substrate outside the lithographic apparatus, may result in the mentioned deviation. Since the measured positions of the alignment marks are used to determine the target positions or portions, i.e. the positions at which a subsequent pattern needs to be projected, a deviation between the actual mark position and a measured mark position may cause an erroneous determination of said target position.

As a result, the subsequent layer may be projected or exposed on a position which is not in line, i.e. not aligned, with the previously exposed pattern, resulting in a so-called overlay error. In a lithographic processing environment, substrates that have been exposed may e.g. be examined in a metrology tool or system that is configured to measure an overlay or overlay distribution on a substrate. When such overlay or overlay distribution is known, it may e.g. be applied as a feedback to the exposure process in order to improved that accuracy of the exposure process. In order to determine the overlay, use is made of overlay marks which may be distributed, in a similar manner as the alignment marks, over a substrate. Such overlay measurements may however also be affected by deformations of the overlay marks.

SUMMARY

It is desirable to obtain a more accurate alignment of a previously exposed pattern on a substrate with a patterning device prior to performing an exposure of a subsequent pattern. Further, it would be desirable to provide in a more accurate assessment of an overlay error on a substrate or a lot of substrates.

In accordance with an aspect of the present invention, there is provided a method of characterizing a deformation of a plurality of S substrates, each comprising a plurality of m alignment marks, the method comprising the steps of:
  performing for each substrate of the plurality of S substrates;
    for each of the plurality of m alignment marks on the respective substrate of the plurality of S substrates;
      measuring, for each of a plurality of n different alignment measurement parameters λ, a position of the respective alignment mark using the respective alignment measurement parameter so as to obtain n alignment mark position measurements for the respective alignment mark on the respective substrate;
      determining, for each of the plurality of n different alignment measurement parameters λ, a positional deviation as the difference between the n alignment mark position measurements and a nominal alignment mark position, thereby obtaining n positional deviations for the respective alignment mark m of the respective substrate;
  grouping the positional deviations into a plurality of data sets;
  determining an average data set;

subtracting the average data set from each of the plurality of data sets to obtain a plurality of variable data sets;

performing a blind source separation method such as a Principal Component Analysis on the variable data sets, thereby decomposing the variable data sets into a set of eigenwafers representing principal components of the variable data sets;

subdividing the set of eigenwafers into a set of mark deformation eigenwafers and a set of substrate deformation eigenwafers.

In accordance with another aspect of the present invention, there is provided a method of characterizing an overlay measurement process using a plurality of S substrates, each comprising a plurality of m overlay targets, the method comprising the steps of:

performing for each substrate of the plurality of S substrates;
  for each of the plurality of m overlay targets on the respective substrate of the plurality of S substrates the step of:
    deriving a set of overlay measurements by measuring, for each of a plurality of n different overlay measurement parameters $\lambda$, an overlay of the respective overlay target using the respective overlay measurement parameter so as to obtain n overlay target measurements for the respective overlay target on the respective substrate;
  determining, based on the set of overlay measurements:
    substrate-to-substrate overlay variations of the set of overlay measurements,
    color-to-color overlay differences by combining overlay measurements obtained using different overlay measurement parameters $\lambda$, and;
    substrate-to-substrate variations of the color-to-color differences;
  expressing the substrate-to-substrate overlay variations, as a weighted linear combination of the substrate-to-substrate variations of the color-to-color differences, so as to obtain a set of equations having weight coefficients;
  solving the set of equations for the weight coefficients.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
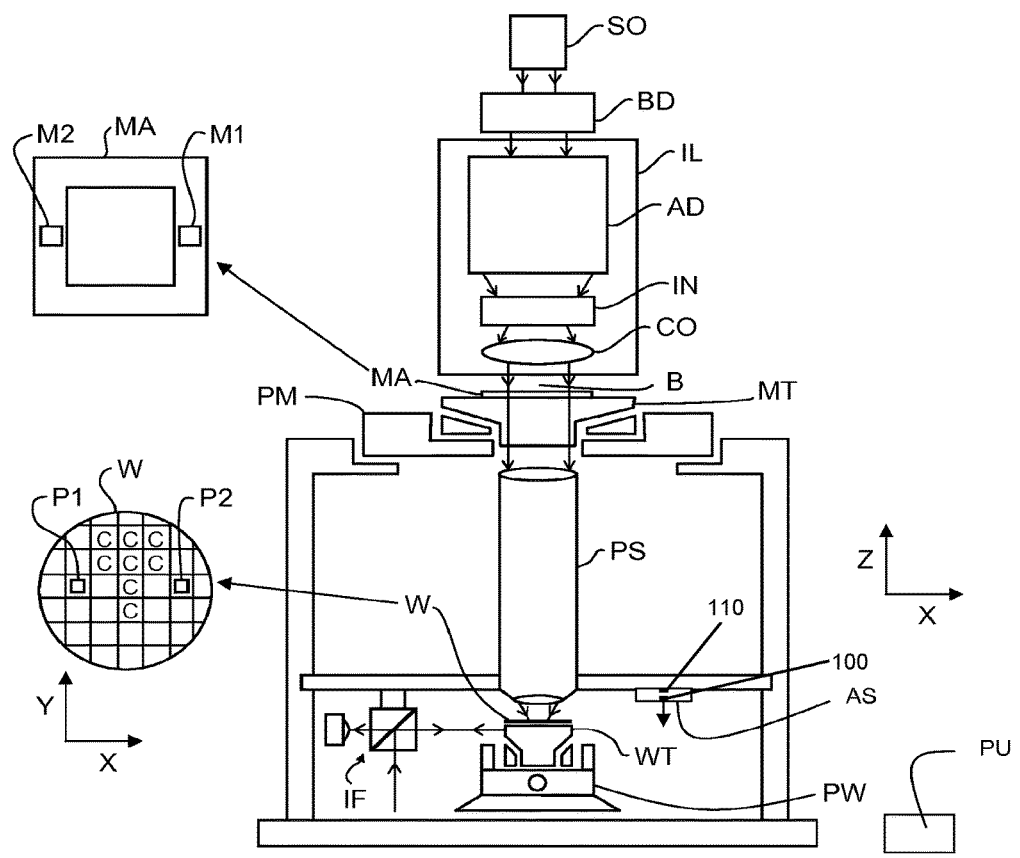
FIG. 1 depicts a lithographic apparatus according to an embodiment of the invention.
Figure 1:
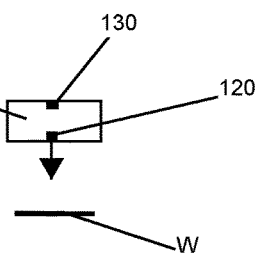

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In accordance with an embodiment of the present invention, the lithographic apparatus further comprises an alignment system AS configured to determine a position of one or more alignment marks that are present on a substrate.

The alignment system AS according to the present invention or the alignment method according to the present invention enable to obtain, in a more accurate manner, an actual position of a plurality of alignment marks that are provided on a substrate and as a result, provide in an improved way of performing an alignment between a substrate (e.g. provided with a pattern during an exposure process) and a patterning device. In particular, the present invention provides in a method of obtaining a more accurate alignment by taking deformations of alignment marks, e.g. particular asymmetries, into account. It has been observed by the inventors that such alignment mark deformations may cause errors in the alignment measurement process. In particular, alignment mark deformations may cause discrepancies between the positions of the alignment marks as measured and the actual positions.

In accordance with the present invention, the alignment system AS as applied is configured to perform a plurality of different alignment measurements, thereby obtaining a plurality of measured alignment mark positions for the alignment mark that is considered. Within the meaning of the present invention, performing different alignment measurements for a particular alignment mark means performing alignment measurements using different measurement parameters or characteristics, the different measurement parameters or characteristics as applied are, within the meaning of the present invention, denoted as different values of a parameter $\lambda$. Such different measurement parameters or characteristics $\lambda_1, \lambda_2, \lambda_3, \ldots \lambda_i$ may e.g. include using different optical properties to perform the alignment measurement. As an example, the alignment system as applied in the lithographic apparatus according to the present invention may include an alignment projection system 100 configured to project one or more alignment beams having different characteristics or parameters $\lambda_1, \lambda_2, \lambda_3, \ldots \lambda_i$ onto alignment mark positions on the substrate and a detection system 110 configured to determine an alignment position based one or more reflected beams off of the substrate.

In an embodiment, the alignment projection system may be configured to sequentially project different alignment beams (i.e. beams having different characteristics or parameters $\lambda_1, \lambda_2, \lambda_3, \ldots \lambda_i$) onto a particular position on a substrate to determine an alignment mark position.

In another embodiment, a plurality of different alignment beams may be combined into one alignment beam having different characteristics or parameters $\lambda_1, \lambda_2, \lambda_3, \ldots \lambda_i$ that is projected onto the substrate to determine the alignment mark position. In such embodiment, it may be advantageous to arrange for the reflected beams off of the substrate to arrive at the detection system at different instances. In order to realize this, use can e.g. be made of a dispersive fiber as e.g. described in U.S. Pat. No. 9,046,385, incorporated herein by reference. Alternatively, the reflected alignment beam, including a plurality of different reflected alignment beams off of the substrate, may be provided to one or more filters to separate the different reflected alignment beams and assess the alignment mark position. Within the meaning of the present invention, different measurement parameters or characteristics $\lambda_1, \lambda_2, \lambda_3, \ldots \lambda_i$ as applied by the alignment system include at least a difference in polarization or a difference in frequency or frequency content of an alignment beam or the alignment beams used.

The alignment system according to the present invention, may thus determine, using the different measurement parameters or characteristics $\lambda_1, \lambda_2, \lambda_3, \ldots \lambda_i$ (e.g. using alignment beams having a different color, i.e. frequency or frequency content), a position of an alignment mark. Note that, within the meaning of the present invention, "color" should not be understood as being limited to visible light, but may e.g. also encompass UV or IR radiation, i.e. radiation outside the visible light spectrum.

In an embodiment, the alignment system AS may be configured to perform the position measurements based on one or more diffractions of one or more measurement beams incident on the substrate. In general, the object of such alignment mark measurements as performed by the alignment system AS is to determine or estimate a position of the target portions (such as target portions C as shown in FIG. 1) of a next exposure process.

In order to determine these target portion positions, positions of alignment marks, which are e.g. provided in scribe-lanes surrounding the target portions, are measured. In general, the alignment marks as applied may also include so-called in-die marks or in-product marks, i.e. alignment marks that are located inside the exposed pattern. When the alignment mark positions as measured deviate from nominal or expected positions, one can assume that the target portions where the next exposure should take place, also have deviating positions. Using the measured positions of the alignment marks, one may determine or estimate, by means of modelling, the actual positions of the target portions, thus ensuring that the next exposure can be performed at the appropriate position, thus aligning the next exposure to the target portion.

Note that, in case the patterns of two consecutive layers would not be properly aligned, this could cause a malfunction in the circuit that is manufactured. Such a positional deviation or positional offset between two consecutive layers is often referred to as overlay. Such an overlay may be determined by off line measurements performed once two consecutive layers have been created by exposure processes. Ideally, the alignment process, i.e. the process to determine a position of a previously created layer of patterns based on a position measurement of alignment marks, provides in an accurate determination of the actual position of the alignment marks, based upon which, by appropriate modelling, an accurate determination of the actual position of a previously exposed pattern can be determined. This modelling involves determining, using the determined position of the alignment marks that are e.g. disposed in scribe lanes, the position of the previously exposed patterns. This position of a previously exposed pattern, i.e. the position of the previously exposed layer of the integrated circuits that are manufactured, may then be used as a target position for a next exposure process, i.e. the process of exposing a subsequent layer of the integrated circuit). Such modelling may involve various mathematical techniques such as mapping the alignment mark positions onto higher order two-dimensional polynomials or other functions, or interpolations. Within the meaning of the present invention, it is assumed that this modelling does not introduce any further deviations or errors. Phrased differently, any errors introduced due to the processing of the alignment mark positions to arrive at the positions of the target portions, which errors would introduce a further overlay, are disregarded or assumed to be non-existent. The same holds for the actual exposure process, which is assumed to project a subsequent pattern accurately onto the target portion.

One of the main reasons for performing an alignment measurement between two consecutive exposures is to take into account any deformations of the substrate that may have occurred after a previous exposure. In general, a substrate will undergo a plurality of processing steps between the creation of two consecutive patterns, these processing steps potentially causing deformations of the substrate and thus displacements of the alignment marks. These displacements of the alignment marks may be characterized as positional deviations of the alignment marks, i.e. deviations between a measured position of an alignment mark and a nominal or expected position of the alignment mark.

Similar to the modelling as described above, when a plurality of measured alignment mark positions are available, and positional deviations, i.e. deviations of the expected alignment mark positions, are determined, these deviations may e.g. be fitted to a mathematical function so as to describe the deformation of the substrate. This may e.g. be a two-dimensional function describing a deviation $\Delta(x,y)$ as a function of an (x,y) position, the x-coordinate and y-coordinate determining the position in a plane spanned by the X-direction and Y-direction. Using such a function, one may then determine or estimate an actual position of a target portion where a next layer or pattern needs to be projected.

In general, one would expect that a measured alignment mark position would not deviate, depending on the measurement parameter or characteristic $\lambda$ that is used, e.g. the type of alignment beam that is applied.

However, it has been recognized by the inventors that an alignment position measurement as performed by an alignment system may be disturbed by a deformation or asymmetry of the alignment mark itself. Phrased differently, due to a deformation or asymmetry of an alignment mark, a deviating alignment mark position measurement can be obtained, i.e. deviating compared to a situation whereby the alignment mark is not deformed. In case the measurement result is not corrected, such deviating alignment mark position measurement could thus result in an erroneous determination of the alignment mark position. It should be noted that the deviation of the deviating alignment mark position measurement is thus caused by a deformation of the alignment mark and is thus not caused by an actual displacement of the alignment mark itself. With respect to this type of deviation, i.e. a deviating position measurement caused by an alignment mark deformation, the inventors have made the following observation. It has been observed that a deviation position measurement which is caused by a deformation or asymmetry of the alignment mark depends on the alignment measurement parameter or characteristic $\lambda$ as applied. As an example, when an alignment mark position is measured using different measurement characteristics $\lambda$, e.g. using alignment beams having a different frequency, this may lead to different results, i.e. the results would be interpreted as corresponding to different measured positions for the alignment mark.

As such, when a position of an alignment mark is measured using a plurality of different measurement characteristics $\lambda_1, \lambda_2, \lambda_3, \ldots \lambda_i$, e.g. using alignment beams having a different frequency or a single alignment beam comprising beams having different frequencies, different results are obtained, e.g. a plurality of different alignment mark positions may be obtained based on the measurements.

As will be clear from the above, the outcome of the alignment measurement procedure should be an assessment of the actual substrate deformation, i.e. an assessment of the actual positions of the alignment marks, which may then be used to determine an actual position of the target portions for a subsequent exposure.

In view of the effects described, in particular the effects of the alignment mark deformations, the measured alignment mark positions, i.e. the alignment mark positions as derived from the different measurements (i.e. using different measurement characteristics), are both affected by the actual (unknown) substrate deformation and by occurring (unknown) mark deformations causing deviating alignment position measurements. Both effects may be interpreted as a deviation between an expected alignment mark position and a measured alignment mark position. As such, when a position deviation is observed, it may either be caused by an actual substrate deformation or by an alignment mark deformation or by a combination thereof.

Figure 2:
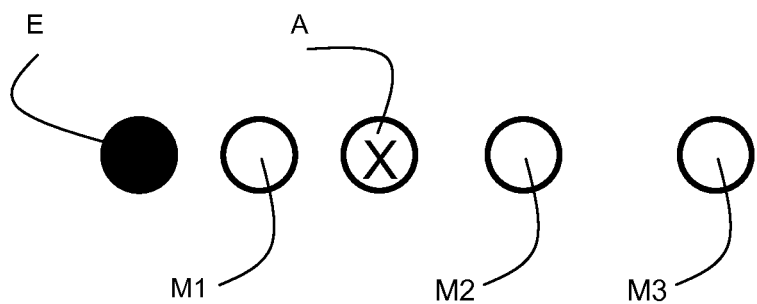
FIG. 2 depicts several possible alignment measurement results when applying different measurement parameters.
Figure 2:
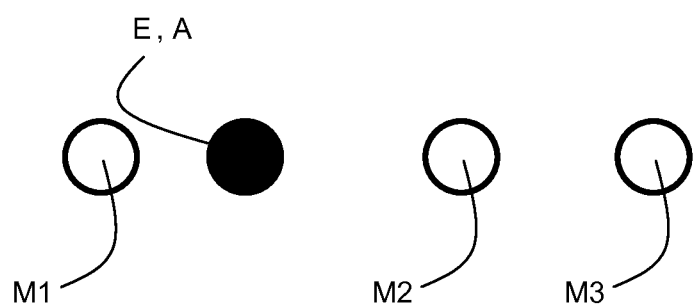
Figure 2:
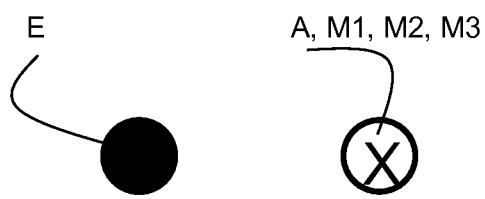

FIG. 2 schematically depicts some possible scenarios; Assuming that three measurements M1, M2, M3 are performed to determine a position of an alignment mark X. FIG. 2 (a) schematically shows the nominal or expected position E of the alignment mark and the measured positions M1, M2, M3. FIG. 2 (a) further shows the actual position A of the alignment mark. As can be seen, none of the measurements performed provide in an accurate representation of the actual position deviation (E-A), i.e. the difference between the expected position E and the actual position A. The scenario as depicted in FIG. 2 (a) thus involves an actual displacement of an alignment mark (the actual alignment mark position A differs from the expected position E) combined with a mark deformation causing deviating measurements.

FIG. 2(b) shows an alternative scenario whereby differences are observed in the measurements (M1, M2, M3), the measured positions differing from the expected position E, while the actual position A is assumed to coincide with the expected position E. In this scenario, the measurements would imply that there is a positional deviation of the alignment mark, whereas, in reality, there is none, i.e. the position of the alignment mark is not affected by a substrate deformation.

FIG. 2 (c) schematically shows a third scenario whereby all three measurements M1, M2, M3 coincide and coincide with the actual position A. Such a scenario may occur when there is no alignment mark deformation affecting the measurements.

As will be clear from the various scenarios depicted, one needs be able to distinguish between the effects of a mark deformation and the effect s of a substrate deformation, in order to arrive at a proper assessment of the actual alignment mark position.

With respect to the occurring substrate deformations and mark asymmetries or mark deformations, the following should be noted: As already indicated above, in between two consecutive exposure steps, i.e. the consecutive application of particular patterns onto target portions such as target portions C as shown in FIG. 1, a substrate undergoes various processes outside the lithographic apparatus. These processes may cause the aforementioned substrate deformations and mark deformations or mark asymmetries.

Two types of process equipment are generally used for the processing of substrates outside a lithographic apparatus, affecting the substrates in a different manner.

A first type of equipment can be characterized as surface modifying equipment, such equipment or process tool processing the exposed surface of the substrate. Examples of such tools include tools for etching a substrate or tools for rendering the top surface substantially flat, such as CMP (Chemical Mechanical Planarization) tools.

A second type of equipment can be characterized as processing the substrate as a whole, or the bulk of the substrate. Such processing e.g. include thermal processing of the substrate or mechanical handling of a substrate. Typically, these bulk modifying tools may introduce mechanical stresses in the substrate resulting into strain, i.e. a deformation of the substrate.

It has been observed by the inventors that the first type of equipment typically results in deformations of the alignment marks themselves, and e.g. introduces mark asymmetries. The second type of equipment has been devised to result in actual deformations of the substrate as a whole, thus resulting in actual displacements of the alignment marks with respect to their expected or nominal position.

As such, in general, when a substrate is brought into a lithographic apparatus after being processed, both mark deformations and substrate deformations may have been introduced due to the processing.

As such, when subsequently the position of a plurality of alignment marks on the substrate is determined using an alignment system AS according to the present invention, the position measurements may be affected by both mark and substrate deformations.

With respect to both the mark deformations and the substrate deformations as caused by process tools, it may further be noted that these deformations are not randomly distributed over a substrate but rather follow particular patterns. Some of these deformation patterns may be regular patterns such as e.g. vortex or double vortex patterns, which may be cast into comparatively straightforward mathematical expressions, e.g. using one or more two-dimensional polynomials of the like. Often however, more complex mathematical expressions are needed to model the occurring deformations.

Figure 3A:
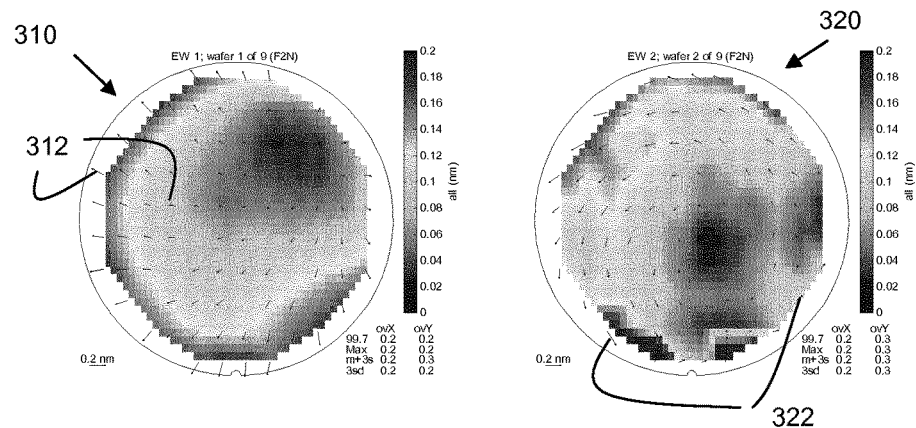
FIGS. 3a and 3b depicts several possible positional deviations as measured, caused by substrate deformations or mark deformations.

FIG. 3a schematically shows some typical deformation patterns.

The deformation pattern 310 as shown on the left is a predominant radial deformation, the line segments 312 indicating amplitude and direction of positional deviations of alignment marks as determined from measurements. Such a deformation pattern may e.g. be caused by an etching process.

The deformation pattern 320 as shown on the right is a predominant rotational deformation, the line segments 322 indicating amplitude and direction of positional deviations of alignment marks as determined from measurements. Such a deformation pattern may e.g. be caused by a CMP process.

It can be noted that both etching and CMP are processes that cause a deformation of the alignment marks themselves, substantially without causing an actual deformation of the substrate as a whole. Therefore, the indicated deformations or positional deviations are apparent or virtual deformations of the substrate.

Figure 3B:
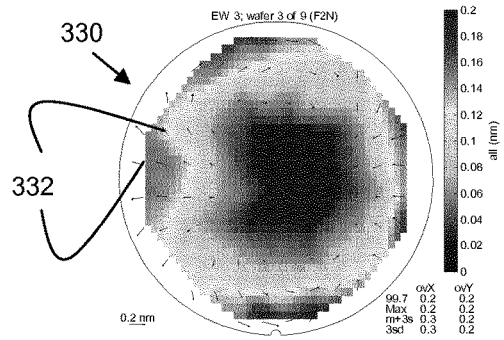

FIG. 3b schematically shows a deformation pattern 330 comprising a dominant double vortex or swirl pattern. Such a pattern, the line segments 332 indicating amplitude and direction of the deformation, is typically caused by bulk processing equipment, which deforms the substrate as a whole. The deformation pattern 330 thus corresponds to an actual substrate deformation.

As illustrated by the above, it can be noted that the deformation pattern as observed depends on the type of processing equipment or the type of process the substrate has been subject to. As an example, a substrate that has been subjected to a CMP-process may have a particular deformation pattern that is different from the deformation pattern of a substrate that has been subjected to an etching process or an annealing process.

Figure 4:
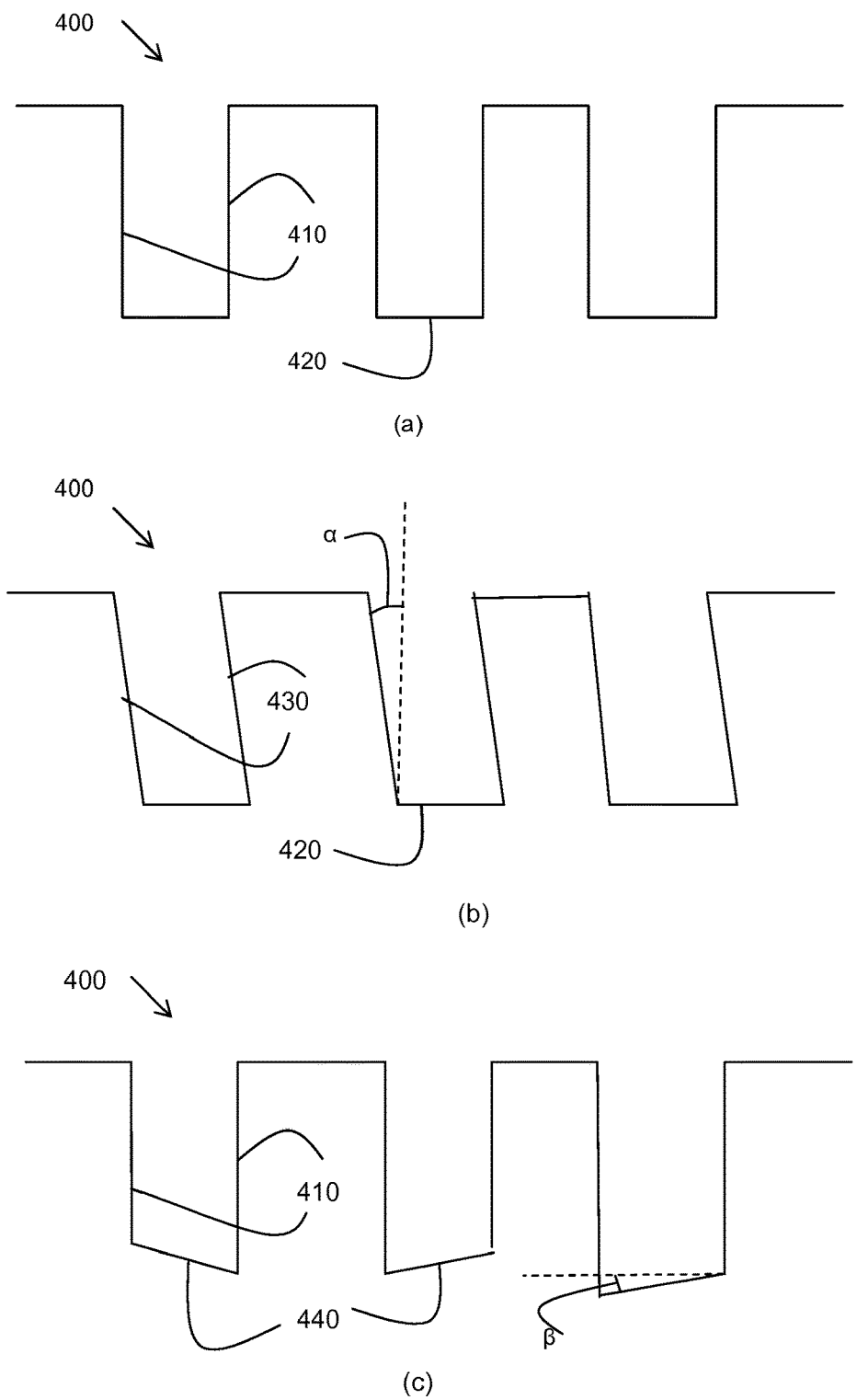
FIG. 4 depicts a cross-section an alignment mark and possible alignment mark deformations.

FIG. 4 schematically depicts some mark deformations which may occur during the processing of substrates and which may e.g. cause the apparent or virtual positional deviations of the alignment marks. FIG. 4 schematically shows a cross-sectional view of (part of) an alignment mark 400. FIG. 4 (a) schematically shows the alignment mark 400 without any deformations, i.e. having substantially vertical side walls 410 and a substantially horizontal bottom portion 420.

FIG. 4 (b) schematically shows the alignment mark 400 having slanted or sloped side walls 430. Such slanted side walls may e.g. be caused by surface modifying processes such as etching or CMP.

FIG. 4 (c) schematically shows the alignment mark 400 having a tilted bottom portion 440. Both alignment mark deformations as illustrated in FIGS. 4 (b) and 4 (c) may give rise to deviating alignment mark position measurements which may thus be interpreted as apparent o virtual positional deviations of the alignment mark.

Typically, one can assume that each processing step performed on a substrate after being exposed can introduce a particular deformation.

It is an object of the present invention to provide in a processing of alignment data in such manner that the effects of alignment mark deformations or asymmetries (which effects may be considered virtual displacement of the alignment mark) are at least partly separated from an actual displacement of the alignment mark, i.e. caused by an actual deformation of a substrate.

In an embodiment, the separation of both effects is realized by relying on the following property:

As indicated above, it has been observed that mark deformation may result in deviating alignment mark position measurement, whereby the deviation depends on the alignment measurement characteristic or parameter $\lambda$. On the other hand, in case an alignment mark position deviation is caused by a substrate deformation, the alignment mark position measurement will be consistent, i.e. substantially the same measurement result will be obtained, irrespective of the applied alignment measurement characteristic or parameter $\lambda$. As such, when a position of an alignment mark is determined using different alignment measurement characteristic or parameter $\lambda$ and the results are different, one can conclude that the alignment mark position measurements contain a contribution caused by an alignment mark deformation or asymmetry. In the present invention, alignment data of a plurality of substrates that have been subjected to the same or similar processing steps is analyzed in or to at least separate the contribution of an alignment mark deformation or asymmetry. As an example, a batch of substrates (e.g. 50 substrates), each substrate having 25 alignment marks, may be considered. When applying an alignment system AS that is equipped to perform alignment measurements using 4 different measurement parameters or characteristics $\lambda$, 4 alignment mark position measurements may be performed for each of the 25 alignment marks on each of the 50 substrates. Subtracting the nominal or expected alignment mark positions results in a set of alignment mark positional deviations, or in brief, positional deviations. Using this set of alignment mark positional deviations, a statistical analysis may be performed (see further on) enabling to, at least partly, separate the contribution of an alignment mark deformation or asymmetry from the position deviations that result from a substrate deformation. Since this contribution does not correspond to an actual deformation or position deviation, correcting for this contribution results in a more accurate determination of the actual alignment mark position.

In accordance with the present invention, the alignment mark positional deviations are grouped in so-called "data sets" onto which the statistical analysis is performed.

The statistical analysis as applied in the present invention involves the application of a so-called Blind Source Separation method (e.g. a Principal Component Analysis), such method involving the processing of a plurality of data sets, also referred to as observations. The feature "data set" is thus used to denote an amount of data (e.g. derived from alignment measurements) that is used in such methods.

In an embodiment, an alignment system AS as applied in the present invention may e.g. be configured to perform alignment mark position measurements using measurement beams of 8 to 16 different wavelengths or frequencies, e.g. each at 2 different polarizations.

The statistical analysis as mentioned above may be applied in various manners to the plurality of data sets that are derived from the alignment data. In particular, to perform this analysis, the alignment data can be grouped in various manners to arrive at the required plurality of data sets.

Referring to the example of a batch of 50 substrates S, each having 25 alignment marks, whereby the position of each alignment mark has been measured using 4 different measurement parameters $\lambda_1$, $\lambda_2$, $\lambda_3$ and $\lambda_4$.

Note that it is assumed that the 25 alignment marks have the same nominal positions on each of the 50 substrates.

Each alignment mark on each of the substrates is thus measured using 4 different measurement parameters $\lambda_1$, $\lambda_2$, $\lambda_3$ and $\lambda_4$.

Figure 5:
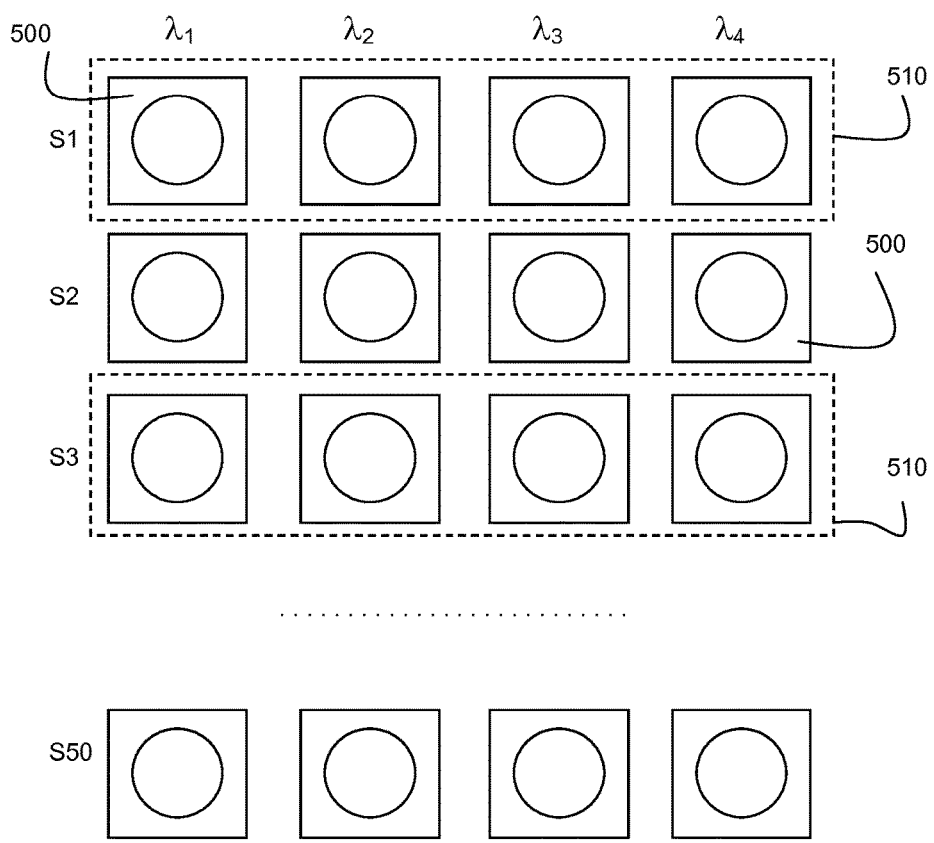
FIG. 5 schematically depicts possible groupings of the positional deviations of the alignment marks into data sets.

When the nominal position of each of the alignment marks is subtracted from the measurements made, one obtains, per substrate, 4 sets of alignment mark positional deviations. FIG. 5 schematically depicts the sets of alignment mark positional deviations for the batch of substrates. FIG. 5 schematically shows, for each substrate S1 to S50, 4 sets of alignment mark position deviations 500, one set for each of measurement parameters (indicated by $\lambda_1$, $\lambda_2$, $\lambda_3$, $\lambda_4$). Each set 500 thus consist of 25 alignment mark positional deviations as obtained from measuring the 25 alignment marks of a particular substrate of the substrates S1 to S50 with a particular measurement parameter $\lambda$. Note that, for clarity, FIG. 5 does not show the individual alignment mark positional deviations as was done in FIGS. 3a and 3b.

In order to perform the statistical analysis as mentioned above, the alignment data as e.g. represented in FIG. 5 is grouped into a plurality of data sets.

In a first embodiment, referred to as the separated data embodiment, each set of alignment mark positional deviations obtained for a particular substrate using a particular measurement parameter, such as the sets 500, is considered a separate data set. For the example given above (having 50 substrates and 4 different measurement parameters $\lambda$) this would thus result in 200 data sets.

In a second embodiment, referred to as the grouped data embodiment, the sets of alignment mark positional deviations are grouped per substrate and are taken together as one data set. For the example given above, this would thus result in 50 data sets. Reference number 510 in FIG. 5 indicates two of such data sets.

It should be noted that other groupings of the sets of alignment mark positional deviations to arrive at the plurality of data sets may be considered as well, e.g. combining of pairs of substrates or pairs of measurement parameters.

In accordance with the present invention, the statistical analysis is performed on the variable or varying part of the data sets, further on also referred to as the variable data sets. Within the meaning of the present invention, the variable data sets, i.e. the variable part of the data sets, comprise the variations observed in the data sets relative to an average data set.

The calculation of such an average data set may vary depending on which grouping is applied to arrive at the data sets. Further, different average data sets may be defined and applied to different sets of alignment mark positional deviations. As such, different variable data sets may be obtained, depending on the used average data set.

In case of the separated data embodiment, a first example of deriving the variable data sets is to calculate an average data set by taking, for each alignment mark, the average value of all alignment mark positional deviations associated with that alignment mark. Referring to FIG. 5, such an average data set would thus be an average of all data sets 500.

The variable data sets may then be obtained by subtracting the average data set from each of the data sets.

In a second example associated with the separated data embodiment, the variable data sets are determined by determining, for each of the alignment measurement parameters, a specific average data set and subtract the specific average data set of each of the data sets that are associated with the specific measurement parameter.

Referring to FIG. 5, the specific average data set would thus be obtained by averaging the data sets 500 per column. In this example, 4 average data sets would thus be obtained by averaging the data sets 500 of the respective columns indicated by $\lambda_1$, $\lambda_2$, $\lambda_3$, $\lambda_4$.

The variable data sets in this second example may then be obtained by subtracting the average data set of column $\lambda_1$ from the data sets of column $\lambda_1$, subtracting the average data set of column $\lambda_2$ from the data sets of column $\lambda_2$, . . . and so on.

It can further be noted that the average data set as specified in the first example has been found to result in a statistical analysis (see further on) that is less sensitive to noise.

In case of the grouped data embodiment, an average data set may be obtained by averaging, for each alignment mark, the average value of all alignment mark positional deviations associated with that alignment mark, per measurement parameter $\lambda$. In this embodiment, for the above example, the average data set would thus consist of 100 averaged alignment mark position deviations, each averaged alignment mark positional deviation being the average of 50 alignment mark positional deviations. Phrased differently, the average data set in the grouped data embodiment may be considered as the average of all 50 data sets as indicated by reference number 510 in FIG. 5. The described average data sets are further on also referred to as the stable (or static) deformation pattern of a batch or lot of substrates. For each substrate of the batch or set of substrates, the actual alignment mark position deviations may be compared to this averaged pattern. In particular, each data set as defined above may be compared with the average data set. The difference between both, i.e. the variable data set, is further on also referred to as the dynamic (or variable) deformation pattern. The stable deformation pattern is also referred to as the static fingerprint, whereas the dynamic deformation pattern is referred to as the dynamic fingerprint. Within the meaning of the present invention, the stable deformation pattern or static fingerprint thus refers to the average deformation as observed over a plurality of substrates, e.g. an average deformation (i.e. positional deviation) determined from alignment measurements for an entire batch or lot of substrates. The dynamic fingerprint refers to the deformation patterns which describe the variations in the deformations that are observed from substrate to substrate; when considering the deformations for an entire batch or lot of substrates, one can notice that there is a systematic or consistent part in this deformation and a variable part, varying from substrate to substrate (S2S). This can be explained as follows:

As already indicated above, the processes as performed by the processing equipment introduce particular deformation patterns, which are noticeable in all the processed substrates, since each substrate in a batch or lot has undergone the same process or processes. However, due to slight changes in the processing conditions or slight physical differences between the individual substrates, the actual magnitude of the deformations may differ between substrates. As such, when a batch of substrates has been processed by a particular tool (e.g. a CMP-tool or etching-tool), each of the substrates processed will have a similar deformation pattern due to the processing. The average deformation pattern of the substrates may then be considered the static fingerprint, whereas the S2S variations, i.e. the variations relative to the average deformation pattern, can be considered the dynamic fingerprint.

Note that in general, both the static and the dynamic fingerprint include effects of both mark deformations and substrate deformations. It can further be noted that systematics or patterns can be noted in both the static fingerprint and the dynamic fingerprint.

In the present invention, the focus will be on modelling the dynamic fingerprint and correcting for the S2S variations that are caused by mark deformations or mark asymmetries.

In accordance with the present invention, a model is derived for the S2S variations relative to the average deformation pattern. Based on this model, the effects of the mark deformations can be determined and taken into account when determining the alignment position of a substrate.

Within the meaning of the present invention, it is proposed to describe the dynamic fingerprint as a combination of one or more basis shapes, herein referred to as "eigenwafers", each describing a particular deformation pattern. As already indicated above, each processing step that is performed on an exposed substrate, may give rise to a particular deformation or deformation pattern, e.g. a mark deformation pattern or substrate deformation pattern or a combination thereof. The present invention proposes a method which enables to retrieve or estimate the deformation patterns that have occurred during the overall process to which a substrate has been subjected in between the exposure of two subsequent layers, based on alignment mark position measurements, performed prior to an exposure of a layer.

In particular, the dynamic fingerprint as e.g. determined for a batch or lot of substrates is analyzed and described as a combination (e.g. a weighted linear combination) of a set of basis shapes or "eigenwafers", i.e. by performing a statistical analysis on the variable data sets as determined.

In an embodiment of the present invention, the so-called Principal Component Analysis (PCA) is applied on the variable data sets to determine the eigenwafers. PCA is an example of the more general set of methods known as blind source separation methods. Blind source separation refers to the separation of a set of source signals from a set of mixed signals or observations, substantially without information about the source signals or the mixing process. Such a problem is in general highly underdetermined. Blind source separation methods have typically been used to separate a plurality of temporal signals such as audio. However, blind signal separation may also be used on multidimensional data, such as images or other types of data which do not involve a time dimension. Known blind source separations methods which may be applied in the present invention include PCA and ICA (independent component analysis).

PCA is a statistical procedure that uses an orthogonal transformation to convert a set of observations of possibly correlated variables into a set of values of linearly uncorrelated variables called principal components. The number of principal components is less than or equal to the number of original variables. This transformation is defined in such a way that the first principal component has the largest possible variance (that is, accounts for as much of the variability in the data as possible), and each succeeding component in turn has the highest variance possible under the constraint that it is orthogonal to (i.e. uncorrelated with) the preceding components. Within the meaning of the present invention, the principal components as obtained when a PCA is performed using the variable data sets as observations, correspond to the aforementioned eigenwafers.

The grouping and processing of the alignment data as described above may thus be summarized as follows:

When alignment data is available for a set of substrates, whereby alignment measurements are performed using different alignment measurement parameters or characteristics, one can process this data by:

Subtracting the respective nominal alignment mark positions to arrive at alignment mark positional deviations;

Grouping the alignment mark position deviations per substrate (grouped data embodiment) or per substrate and per alignment measurement parameter (separated data embodiment) to arrive at a plurality of data sets;

Determining an average data set (or static fingerprint) and variable data sets (or dynamic fingerprint) of the data sets.

With respect to the latter step, it can be mentioned that there may be various ways to determine an average data set, resulting in different variable data sets. It has been observed that applying the PCA to these different variable data sets results in sets of eigenwafers which are very similar in shape.

Such a set of eigenwafers may subsequently be used to analyze a dynamic fingerprint of a next or subsequent substrate, i.e. a substrate not part of the batch or lot of substrates used to determine the eigenwafers.

Each of the basis shapes or eigenwafers as determined may further be associated with either a mark deformation pattern or a substrate deformation pattern, as will be explained in more detail below. Consequently, if the dynamic fingerprint is described as a combination of a set of basis shapes or eigenwafers, and each eigenwafer can be associated with either a mark deformation pattern or a substrate deformation pattern, one can separate the effect of the mark deformations from the effect of the substrate deformations and correct for the mark deformations. As such, the part of the dynamic fingerprint that is caused by mark deformations, i.e. the part which does not describe an actual substrate deformation, can be identified and taken into account.

As already mentioned above, the alignment mark position deviations of the static fingerprint also include a part that can be attributed to mark deformations and a part that can be attributed to an actual substrate deformation. However, it can be noted that, with respect to the mark deformation part or portion in the average deformation pattern or static fingerprint, this can be compensated for by means of feedback based on overlay measurements. This can be understood as follows: Let's assume that the dynamic fingerprint is zero or non-existent, i.e. all substrates in a batch which are subjected to alignment measurements, show exactly the same deformation pattern. Note that this pattern includes effects of both substrate deformations and mark deformations. In case no effort is put into distinguishing between both effects, one can assume that an alignment error will be made during the exposure process, i.e. an exposed pattern will not be exactly aligned with a previously provided pattern, thus resulting in an overlay error. Such an overlay error may be measured off-line, e.g. using a dedicated processing tool which observes an alignment between a mark (i.e. an overlay mark) provided in the exposed layer and an overlay mark provided in a previously exposed layer. When the overlay error is determined for a plurality of overlay marks, a 2D overlay error pattern may be determined. Such a 2D overlay error pattern may also be determined for a batch of substrates. An average of this 2D overlay error pattern, also referred to as an average overlay data set, may then be used as an indication of the mark deformation part of the static fingerprint. Such an average 2D overlay error pattern or average overlay data set may e.g. be obtained by averaging the overlay errors per overlay mark. In case a batch of substrates consists of 25 substrates and 50 overlay marks are measured per substrate, the average 2D overlay error pattern would thus consist of a set of 50 averaged overlay errors, each averaged overlay error being the average overlay error of a particular overlay mark of the 50 overlay marks, averaged over the 25 substrates.

In the respect, it should be noted that it is assumed that the same set of overlay marks (i.e. marks have substantially the same nominal position on the substrates) is measured to obtain the overlay data.

This average overlay data set may then be used in a feedback loop to correct for this static mark deformation part. The above described process of analyzing a set of substrates, e.g. a batch or lot of substrates, is referred to in the present invention as a method of characterizing a deformation of a plurality of substrates S. Such process can be considered a calibration or training process which results in a set of basis shapes or eigenwafers describing a.o. the dynamic fingerprint of a set of substrates. In an embodiment of the present invention, this set of eigenwafers is subsequently used to correct alignment data, i.e. alignment mark position information, of a subsequent substrate, i.e. a substrate of a next batch or lot of substrates.

Such a calibration or training process may e.g. be performed by a processing unit of the lithographic apparatus according to the present invention. In general, such a processing unit may include one or more processors, microcontrollers, computers or the like. Typically, the processing unit further includes an input terminal for receiving measurement data obtained from the one or more alignment sensors of the alignment system AS.

In accordance with an embodiment of the present invention, such a calibration or training process may comprise the following steps:

In a first step, the method comprises performing for each substrate of a plurality of substrates; and for each of the plurality of m alignment marks on the respective substrate of the plurality of substrates;

measuring, for each of a plurality of n different alignment measurement parameters λ, a position of the respective alignment mark using the respective alignment measurement parameter so as to obtain an alignment mark position measurement;

This step may e.g. be performed by an alignment system AS as e.g. applied in a lithographic apparatus according to the present invention. However, a stand-alone off-line tool may equally be equipped to perform such alignment measurement on a plurality of substrates.

The first step as mentioned results in an alignment data set comprising, for a plurality of substrates of a batch or set, alignment mark position measurements, using a plurality of n different alignment measurement parameters λ (e.g. a plurality of measurement beams having different wavelengths and/or polarization states).

In a next step, the alignment data set is processed, e.g. by a processing unit of the alignment system AS, the stand-alone offline tool or the lithographical apparatus.

In accordance with the method of characterizing a deformation of a plurality of S substrates according to the present invention, the processing includes the following steps:

Determining, for each of the plurality of n different alignment measurement parameters λ, a positional deviation as the difference between the alignment mark position measurement and a nominal alignment mark position.

In this step, the alignment mark position measurements of the respective alignment marks are thus converted to alignment mark positional deviations.

The alignment mark positional deviations may then be grouped in accordance with the grouped data embodiment or the separated data embodiment as described in FIG. 5 in order to arrive at a plurality of data sets. Note that this step may also be performed prior to the step of determining the positional deviations.

Depending on how the data sets are formed, a next step may include:

Determining, for each of the plurality of alignment marks m on the plurality of substrates S and for each of the plurality of n different alignment measurement parameters λ, an average positional deviation a(m, n) as an average of the positional deviations of the alignment mark m of the plurality of alignment marks m of the plurality of substrates S, or:

Determining, for each of the plurality of alignment marks m on the plurality of substrates S an average positional deviation a(m) as an average of the positional deviations of the alignment mark m, irrespective of the applied alignment measurement parameters λ, of the plurality of alignment marks m of the plurality of substrates S.

Note that, as described above, the alignment measurements may be grouped in different manners, whereby alignment measurements obtained by using different alignment measurement parameters λ are either kept separate (referred to above as the separated data embodiment) or are grouped (referred to above as the grouped data embodiment) resulting in different types of data sets. As such, also the average data set representing the average positional deviations may be different depending on whether the alignment data is grouped (i.e. the alignment data of a particular substrate for different alignment measurement parameters λ is considered as one data set or whether the alignment data of a particular substrate for different alignment measurement parameters λ is considered as multiple data sets, each data set associated with a particular alignment measurement parameter λ used.

Referring to FIG. 5, the average data set representing the average positional deviations in case of the grouped data embodiment would thus be the average of all data sets 510, whereas, in case of the separated data embodiment, the average data set representing the average positional deviation would be the average of all data sets 500. In the latter case, the average positional deviations would thus be independent of the alignment measurement parameters λ, whereas in the former case, the average positional deviation for a particular mark m would thus be, for the situation depicted in FIG. 5, a set of 4 values a(m, λ$_1$-λ$_4$)

In this step, the above mentioned static fingerprint of the plurality of substrates S is thus determined.

In a next step, the so-called dynamic fingerprint of the data sets is determined by subtracting the static fingerprint as determined from the data sets, resulting in the variable data sets:

Subtracting, for each of the substrates of the plurality of substrates S, for each of the alignment mark position measurements, the respective average positional deviation a(m, n) to obtain, for each of the substrates a variable data set containing m×n variable positional deviations v(m, n);

In this step, the above mentioned dynamic fingerprint of the plurality of substrates S is determined.

performing a Principal Component Analysis, on an alternative Blind Source Separation method, on the variable data sets of variable positional deviations v(m, n), thereby decomposing the variable data sets of variable positional deviations v(m, n) into a set of eigenwafers representing principal components of the sets of variable positional deviations v(m, n);

subdividing the set of eigenwafers into a set of mark deformation eigenwafers and a set of substrate deformation eigenwafers.

Using the principal component analysis, the processed alignment data of the set of S substrates is decomposed into principal components, or eigenwafers, each describing a particular deformation pattern, e.g. deformation patterns as illustrated in FIG. 3.

As already indicated above, the processing of substrates that have been exposed may involve various different processes, using a plurality of tools, whereby each tool may affect either the processed substrate as a whole, or a top layer of the substrate or both. The eigenwafers as obtained from the principal component analysis, or another blind source separation method, can be considered to represent particular deformation patterns (or apparent or virtual deformation patterns) which may be linked to the different processes to which the substrates have been subjected. Each eigenwafer may thus be associated with either a process that results in an actual substrate deformation (these eigenwafers are referred to as substrate deformation eigenwafers) or with a process that result in a virtual or apparent substrate deformation (these eigenwafers are referred to as mark deformation eigenwafers) Within the meaning of the present invention, mark deformation eigenwafers can thus be considered to describe a virtual deformation in that they described an observed phenomenon, i.e. a particular deviating alignment mark position measurement which however does not correspond to an actual displacement of the mark itself but is caused by a deformation of the mark.

The latter step of distinguishing between the eigenwafers that represent actual substrate deformations and eigenwafers that represent the effect of a mark deformation can be made in various manners, as will be described in more detail below.

Whether or not such phenomenon is present in a set of alignment mark position measurements can be assessed by considering the consistency of a set of alignment mark position measurements for a particular mark that have been performed by means of different alignment measurement parameters, in particular different wavelengths and/or polarizations.

The above described method of characterizing a deformation of a plurality of S substrates can be described mathematically as follows, for the separated data embodiment:

When a substrate is processed outside a lithographic apparatus and e.g. undergoes various processing steps such as CMP or etching or thermal treatments, the substrate may be deformed, resulting in an exposure layer being deformed. This actual deformation of such a layer is referred to as the substrate deformation SD, which, when the substrate is placed on a stage in a stage coordination system (SCS), can be described as combination of an average or consistent substrate deformation (e.g. averaged over a batch or lot of substrates A), S$_{av}$ and a variable part, S$_{S2S}$:

$$SD(S_i)=S_{av}+S_{S2S}(S_i) \quad (1)$$

Wherein S$_i$ indicated substrate i of the batch or set of substrates S.

When alignment measurements are performed on such a substrate, the alignment measurements will not only detect the actual substrate deformation SD but also the impact of any occurring mark deformations, this impact resulting in an apparent or virtual deviating alignment mark position The impact of such a mark deformation MD may equally be characterized by a consistent deformation (averaged over a batch of substrates), M$_{av}$ and a variable part M$_{S2S}$:

$$MD(\lambda,Si)=M_{av}(\kappa)+M_{S2S}(\kappa,S_i) \quad (2)$$

Note that, as already discussed above, the mark deformation effect MD depends on the alignment measurement parameter λ that is used.

Combined, the substrate deformation SD and the mark deformation MD form, for a given λ, the alignment data expressed as positional deviations relative to a nominal or expected position of the alignment marks, of a particular layer L1:

$$AL(L1,\lambda)=S_{av}+S_{S2S}(S_i)+M_{av}(\lambda)+M_{S2S}(\lambda,S_i) \quad (3)$$

Such alignment data can be generated for each substrate in a batch of S substrates.

An alignment to this layer L1 which is based on the alignment data according to equation (3) will introduce an error due to the impact of the mark deformation MD since this does not represent an actual deformation of the substrate.

It can be noted that the alignment measurements as performed typically provide, for each alignment mark and for each value of λ, a one- or two dimensional value, depending on whether the alignment mark is a one-dimensional (1D) or two-dimensional (2D) alignment mark.

Each measurement value, either a 1D or 2D value, indicates a measured position of an alignment mark and may have in fact 4 contributions or contributing factors, as e.g. indicated by equation (3), two of which are representing virtual deformations.

The alignment measurements are thus distorted by two factors (M$_{av}$(λ) and M$_{S2S}$(λ, S$_i$)) which are both due to mark deformations.

When alignment data for a set of S substrates is available, an average positional deviation can be determined for each alignment mark and for each value of λ. These average positional deviations AV_PD are part of the aforementioned static fingerprint and can be expressed as the sum of the variable parts of the substrate deformation SD and the mark deformation MD.

$$AV\_PD(\lambda)=Mav(\lambda)+Sav \quad (4)$$

For a given alignment data set, this average positional deviation can be determined and subtracted from the alignment data (equation (3)) to obtain the aforementioned dynamic or variable fingerprint or substrate to substrate positional deviations S2S_PD:

$$S2S\_PD(\lambda) = M_{S2S}(\lambda, S_i) + S_{S2S}(S_i) \quad (5)$$

This thus constitutes the aforementioned variable data sets which can be analyzed using PCA, Principal Component Analysis, or another Blind Source Separation method such as ICA. Purpose of the analysis is to decompose the variable or dynamic fingerprint S2S_PD into contributing eigenwafers (EW), in particular substrate deformation eigenwafers (SDEW) and mark deformation eigenwafers (MDEW). This is done using the assumption that the dynamic fingerprint of a substrate can be described as a linear weighted combination of equipment specific mark and substrate deformation modes or shapes (MDEW, SDEW), which can be found using the PCA.

It is thus assumed that the variable part, $S_{S2S}$ of the dynamic fingerprint can be expressed as a linear weighted combination of substrate deformation eigenwafers:

$$S_{S2S} = \sum_j a_j \cdot SDEW_j \quad (6)$$

$$M_{S2S}(\lambda) = \sum_k b_k \cdot C_k(\lambda) \cdot MDEW_k \quad (7)$$

Whereby a and b are the weight coefficients, C describes that the contribution of the mark deformation eigenwafers (MDEW) to the variable part of the mark deformation MD is in fact depending on the applied alignment measurement parameter $\lambda$.

In this respect, it can be noted that a mark deformation eigenwafer MDEW is assumed to have a shape or pattern MDEW that is in first principle not affected by the alignment measurement parameter $\lambda$, in particular when said parameter includes an applied wavelength of a measurement beam. Note however that the shape or pattern may depend on the applied polarization of a measurement beam. Note further that both the SDEWs sand MDEWs may be constructed as normalized shapes.

As mentioned, the dynamic fingerprint data which represents substrate to substrate positional deviations gathered for a plurality of substrates, for a plurality of alignment measurement parameters $\lambda$, and for a plurality of alignment marks per substrate, grouped into variable data sets, is processed by means of PCA. It should be noted that this dynamic fingerprint data may be grouped in different ways prior to performing the PCA.

As mentioned, when the alignment measurements have been performed, the alignment data per substrate contains m×n measurements, m being the number of alignment marks on a substrate, n being the number of alignment measurement parameters $\lambda$ that is used.

In the grouped data embodiment, the dynamic fingerprint data is grouped per substrate. As such, when a batch contains S substrates, there are S data sets available for the PCA.

In the separated data embodiment, the dynamic fingerprint data per substrate is grouped per alignment measurement parameter $\lambda$. In such embodiment, the PCA is performed on S×n data sets.

Depending on the manner in which the variable data sets are obtained, the dimensions or size of these variable data sets varies as well. Similarly, the dimensions of the eigenwafers vary as well.

Figure 6:
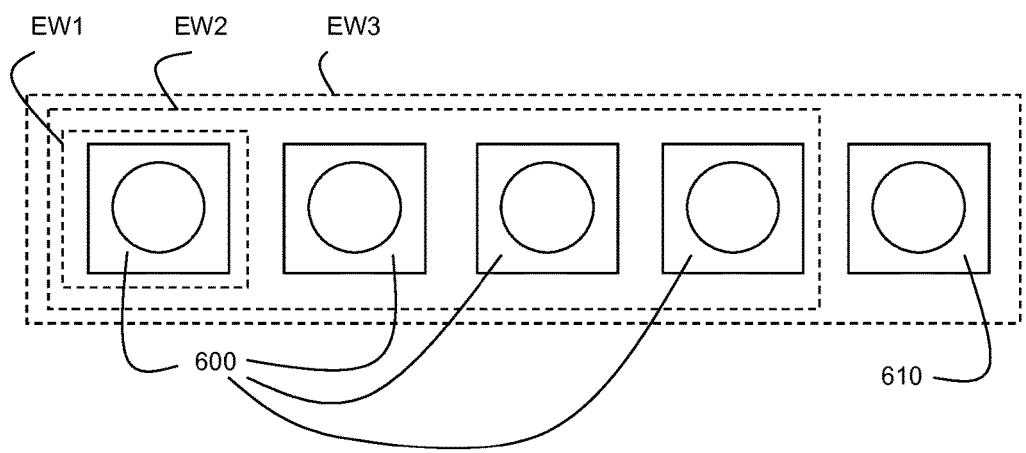
FIG. 6 schematically depicts several possible eigenwafers.

FIG. 6 schematically shows some embodiment of how the eigenwafers can be dimensioned.

In FIG. 6, reference number 600 refers to data structures of the same dimensions as the data sets 500 of FIG. 5, i.e. data sets representing alignment mark positional deviations for a particular substrate, obtained using a particular alignment measurement parameter or characteristic. In case variable data sets are construed that have the same dimensions as such data sets 500, an eigenwafer EW1 can be construed that has the same dimensions.

In case more than one data sets 500, as shown in FIG. 5, are combined (as in the grouped data embodiment) the dimensions of an eigenwafer may correspond to the dimensions of the combined or grouped data sets. In FIG. 6, eigenwafer EW2 e.g. has the same dimensions as a combined or grouped set of 4 data sets of alignment mark positional deviations, e.g. originating from alignment measurements using 4 different alignment measurement parameters or characteristics. In yet another embodiment, which will be explained in more detail below, the alignment mark positional deviations as derived from alignment measurements, is combined with overlay measurement data or overlay data. In such embodiment, the dimensions of an eigenwafer may also be adjusted accordingly. In FIG. 6, reference number 610 refers to a data structure having the same dimensions as a data set representing overlay measurements. In FIG. 6, eigenwafer EW3 therefore has the same dimensions as the combination of EW2 with the data set representing the overlay measurements.

In an embodiment, the dynamic or variable fingerprint or substrate to substrate positional deviations S2S_PD as derived from the alignment measurements performed, is combined with overlay data (OV), i.e. data representing overlay measurements that are performed on the substrate.

In such embodiment, it is assumed that, for the applied set of substrates, overlay measurements have been performed for each substrate of the set of S substrates. It is thus assumed that a second layer L2 is present, i.e. exposed on top of a layer L1, based on the alignment measurements performed on layer L1. Such an exposure of a layer L2 implies that a particular modelling of layer L1 has been performed, i.e. the position of the target portions has been determined based on the alignment measurements performed on layer L1. Such modelling includes the step of determining the alignment mark positions or positional deviations. Since, per alignment mark, multiple deviating measurements may be available, a choice or selection or combination of these measurements needs to be made, to arrive at positional deviations that can be used to determine the positions of the target portions. Within the meaning of the present invention, such a selection or combination of the alignment measurement is referred to as the recipe alignment parameter $\lambda_{rec}$. $\lambda_{rec}$ thus refers to a particular selection or combination of one or more alignment measurements (performed using one or more different alignment measurement parameters $\lambda$) that is used for performing the alignment process of layer L2 with respect to L1. Once such a layer L2 is exposed (using the recipe $\lambda_{rec}$) overlay data can be gathered, by performing overlay measurements, expressing the alignment of the layer L2 relative to layer L1. It can be shown that, when the dynamic fingerprint of these overlay measurements is determined (in a similar manner as the dynamic fingerprint of the alignment data), this variable overlay data set, which is available for each substrate, can be considered to correspond to the variable part of the mark deformation MD, taken at the recipe alignment parameter $\lambda_{rec}$.

As such, the dynamic fingerprint of the overlay measurements S2S_OV can be equated to:

$$S2S\_OV = M_{S2S}(\lambda_{rec}) = \sum_k b_k \cdot C_k(\lambda_{rec}) \cdot MDEW_k \quad (8)$$

Equation (8) can be considered a constraint or condition which effects the eigenwafers EW, i.e. the mark deformation eigenwafers (MDEW) should be such that the weighed combinations as described in equation (8) results in the dynamic fingerprint of the overlay measurements. Phrased differently, when the dynamic fingerprint of the overlay data is combined with the dynamic fingerprint of the alignment data (i.e. the variable data sets derived from the alignment data), a different set of variable data sets is obtained, which may also be subjected to a Blind Source Separation method such as the PCA or ICA.

In an embodiment, such combined variable data sets may be obtained by combining the variable data sets of the grouped data embodiment (e.g. the variable data sets derived from the data sets 510 as shown in FIG. 5) with a variable data set retrieved from the overlay data, i.e. a variable overlay data set. Eigenwafers obtained when such combined variable data sets are processed, e.g. using PCA, would thus have the dimensions of eigenwafer EW3 as shown in FIG. 6.

It has been observed that when the PCA is performed on the combined alignment and overlay data sets (equations (5) and (8)), a more robust outcome may be obtained.

Irrespective of which grouping is applied, the outcome of the PCA, or other blind source separation method, is a set of eigenwafers EW, i.e. principal components into which the variable data sets can be decomposed.

As such, the dynamic fingerprint S2S_PD of a particular substrate can be described as a weighted combination (combining equations (6) and (7)) of the eigenwafers that were found.

Note that initially, when the eigenwafers have been determined, it is not clear whether an eigenwafer EW is either a mark deformation eigenwafer (MDEW) or a substrate deformation eigenwafer (SDEW).

Making this distinction is essential to enable a correction of the alignment data so as to at least partly reduce the effect of mark deformations.

The present invention proposes several different ways to make the distinction between an MDEW and SDEW.

In an embodiment, the analysis relies on an aforementioned property of the mark deformation MD compared to the substrate deformation SD: mark deformation effects as observed in the alignment measurements as depending on the applied alignment measurement parameter $\lambda$. As such, the contribution or weight of a particular MDEW should vary with the alignment measurement parameter $\lambda$. This can be made clear by the following example:

Assuming the dynamic fingerprint data is grouped per alignment measurement parameter $\lambda$;

Assuming that there are two parameters $\lambda 1$, $\lambda 2$ applied;

Assuming that there are two eigenwafers EW(1), EW(2).

The dynamic fingerprint of a substrate Si thus contains, in case of the separated data embodiment, two variable data sets S2S_PD(Si, $\lambda 1$), S2S_PD(Si, $\lambda 2$).

Each of these can be projected or mapped onto the eigenwafers, i.e. described as a weighted combination of the eigenwafers:

$$S2S\_PD(Si,\lambda 1) = \alpha 1 \times EW(1) + \beta 1 \times EW(2); \quad (9)$$

$$S2S\_PD(Si,\lambda 2) = \alpha 2 \times EW(1) + \beta 2 \times EW(2);$$

Using any fitting algorithm, e.g. a least squares fitting, the weight coefficients $\alpha 1$, $\beta 1$, $\alpha 2$, $\beta 2$ can be determined.

In case $\alpha 1 = \alpha 2$ and $\beta 1 \neq \beta 2$, one can conclude that EW(1) is, with a high probability, a SDEW and EW(2) is a MDEW and vice versa.

In another embodiment, pattern recognition may be applied to assess whether an EW is a MDEW or a SDEW. As described above, the deformation patterns (either actual or virtual) as derived from the PCA can be associated with the processes that are performed on the substrates. Further, as described above, it is know that particular devices or tools affect the top layer of a substrate and thus affect the shape or the alignment marks. When typical deformation patterns of such devices are known, these patterns can be compared to the eigenwafers obtained from the PCA and when a correspondence is observed, the eigenwafer deformation pattern can be attributed to a particular tool and based on this, it can be determined whether the eigenwafer is a MDEW or a SDEW.

In yet another embodiment, the assessment may be made by considering the part of the eigenwafer associated with the overlay data. As explained above, in an embodiment, the variable data sets for the statistical analysis may be obtained by combining the variable data sets of the grouped data embodiment (e.g. the variable data sets derived from the data sets 510 as shown in FIG. 5) and a variable data set retrieved from the overlay data. Eigenwafers obtained when such variable data sets are processed, e.g. using PCA, would thus have the dimensions of eigenwafer EW3 as shown in FIG. 6. When such a set of eigenwafers is obtained, the magnitude of the part of the eigenwafers associated with the overlay data, i.e. the data in data structure 610 of FIG. 6, provides an indication that the eigenwafer is an MDEW or an SDEW. This can be understood as follows: considering equation (8), one can deduced that the variable data set associated with the overlay data is to be expressed as a linear combination of parts of the MDEW eigenwafers associated with the overlay data, i.e. the data structures 610, and that there is no contribution to this variable data set based on the SDEW eigenwafers. As such, when the magnitude of the data in the data structure 610 of a particular eigenwafer is zero or substantially zero, one can conclude that this eigenwafer does not contribute to the modelling of the overlay data and, as such, the particular eigenwafer will be an SDEW.

With respect to the separate data embodiment as described above, it is worth noting that the coefficients C as applied in equation (7) may be determined by means of a second statistical analysis such as a PCA. Coefficients C of equation (7) express how a particular MDEW contributes to the variable data set that is obtained using a particular alignment measurement parameter $\lambda$. It has been observed that there is a preferred or optimal set of such coefficients which may be obtained by performing a further PCA using the variable data sets and the eigenwafers as derived as input data. Such a further PCA thus enables to determine an optimal value of the coefficients C for the batch of substrates used in the calibration method.

Once the eigenwafers have been determined and subdivided, this information can be applied to provide in an improved alignment of a new or further substrate.

Therefore, according to an aspect of the present invention, there is provided an alignment method to be performed by a lithographic apparatus, the method comprising, in an embodiment, the steps of:

receiving a substrate by an alignment system in the lithographic apparatus;

performing a plurality of alignment mark position measurements for one or more alignment marks and determining an alignment mark positional deviation as the difference between the alignment mark position measurement and a nominal alignment mark position;

obtaining a set of eigenwafers by performing the method of characterizing a deformation of a set of substrates according to the present invention;

determining a set of variable positional deviations for the substrate based on the average positional deviations derived when performing the method of characterizing a deformation of a set of substrates according to the present invention;

mapping or fitting the set of variable positional deviations of the substrate to the set of eigenwafers thereby obtaining an expression for the set of variable positional deviations of the substrate as a weighted combination of the mark deformation eigenwafers and of the substrate deformation eigenwafers.

subtracting the weighted combination of the mark deformation eigenwafers from the variable positional deviations thereby obtaining a modified set of variable positional deviations of the substrate that are substantially free of mark deformation induced effects;

performing an alignment of the substrate using the modified set of variable positional deviations. The alignment method according to the embodiment makes use of a characterization of a deformation of a set of substrates that is performed and which results in a set of eigenwafers. When a new substrate needs to be aligned, the dynamic fingerprint of this new substrate can be determined (this dynamic fingerprint is referred to as the variable positional deviations of the substrate) using the average or static fingerprint of the set of substrates that was processed earlier. Alternatively, a new average or static fingerprint may be determined using the set or batch of substrates that was processed earlier and the new substrate. Once the dynamic fingerprint of the new substrate has been determined, this dynamic fingerprint can be analyzed and subdivided, using the set of eigenwafers, into a substrate deformation part (representing an actual deformation) and a mark deformation part (representing an apparent deformation), as e.g. expressed by equations (6) and (7).

When this is done, the contribution of the mark deformation eigenwafers can be subtracted from the dynamic fingerprint.

As an alternative, the contribution of the substrate deformation eigenwafers can be used instead of the dynamic fingerprint, thus also obtaining corrected alignment data for performing the alignment. In the latter case, the contribution of the substrate deformation eigenwafers is thus added to the static fingerprint.

In an embodiment, the newly introduced substrate and its alignment data, i.e. the alignment measurements, can become part of the set of substrates that is used to derive the eigenwafers.

In such embodiment, the method of characterizing of a deformation of a set of substrates is actually performed on a set comprising the set of substrates that was available or processed before the new substrate, and the new substrate. As will be acknowledged by the skilled person, such embodiment allows to substantially follow small variations to the static fingerprint.

In an embodiment, the new substrate may e.g. replace one substrate in the set of substrates that was already available earlier, thus keeping the number of substrates in the set constant.

In the embodiments as described above, alignment measurements have been assessed and a method is proposed to correct or improve such measurements. In particular, the methods as described enable to more accurately determine the actual position of an alignment mark, thereby taking account of a possible deformation of the alignment mark.

It can be pointed out that in a similar manner, marks that are used to assess an overlay between two consecutive layers, may be affected as well. In general, as overlay marks are provided on a substrate, they are subjected to the same processes to which the alignment marks are subjected. It can be pointed out that overlay marks may e.g. be provided in scribe lanes or as in-die overlay marks. As a result, in a substantially similar manner as discussed above on alignment measurements, overlay measurements may be affected by such mark deformations as well. In this respect, it can be pointed out that a deviation in the overlay measurement as caused by a deformation of an applied overlay mark or marker has been found to depend on a measurement parameter as applied during the overlay measurement.

In accordance with an aspect of the present invention, there is provided a metrology system configured to perform overlay measurements on a substrate using an overlay measurement system OMS, whereby the overlay measurement system is configured to measure an overlay between consecutive layers on a substrate at various locations on the substrate where overlay marks are provided, by projecting a measurement beam towards the overlay marks. In accordance with the present invention, the overlay measurement system OMS as applied is configured to perform a plurality of different overlay measurements, thereby obtaining a plurality of overlay measurement results for the overlay mark that is considered. Within the meaning of the present invention, performing different overlay measurements on a particular overlay mark means performing overlay measurements using different measurement parameters or characteristics, the different measurement parameters or characteristics as applied are, within the meaning of the present invention, denoted as different values of a parameter $\lambda$. Such different measurement parameters or characteristics $\lambda_1, \lambda_2, \lambda_3, \ldots \lambda_i$ may e.g. include using different optical properties to perform the overlay measurement. As an example, the overlay measurement system as applied in the metrology system according to the present invention may include an overlay projection system 120 configured to project one or more overlay measurement beams having different characteristics or parameters $\lambda_1, \lambda_2, \lambda_3, \ldots \lambda_i$ onto overlay mark positions on the substrate and a detection system 130 configured to determine an overlay measurement result based one or more reflected beams off of the substrate.

Figure 7:
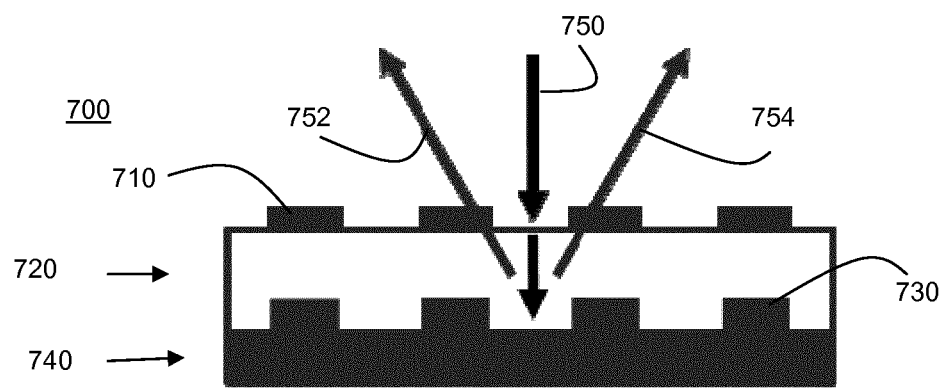
FIG. 7 schematically depicts an overlay measurement setup.
Figure 7:
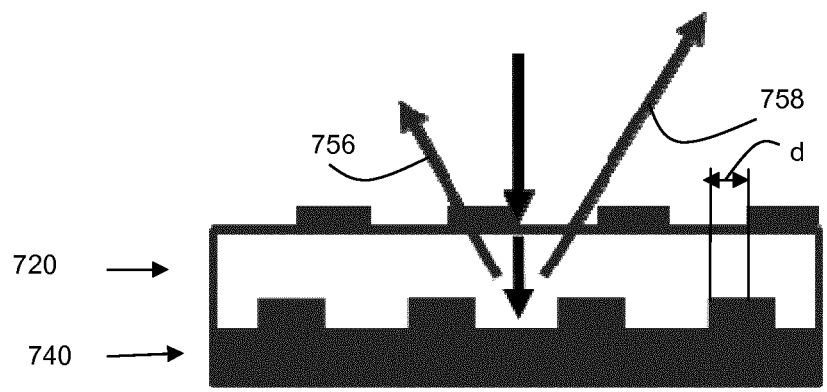

In an embodiment, as will be explained in more detail below, the overlay measurement system may be configured to direct an overlay measurement beam substantially perpendicular to the surface of the substrate and assess the overlay based on reflected beams off of the substrate. In particular, in an embodiment, an overlay between two consecutive layers may be assessed by considering the +1 and −1 reflected order of the reflected overlay measurement beam. An overlay measurement as can be performed using an overlay measurement system OMS is schematically illustrated in FIG. 7.

FIG. 7a schematically shows a cross-sectional view of an overlay mark on a substrate 700, the overlay mark comprising a first pattern 710 on a top layer 720 of the substrate 700 and a second pattern 730 on a lower layer 740 of the substrate 700. When a measurement beam 750 is applied onto the overlay mark, the +1 and −1 orders of the reflected beams (indicated by arrows 752 and 754 respectively) may be captured and their intensity assessed. In case both patterns 710 and 730 are in an aligned position as shown in the cross-sectional view of FIG. 7a, the difference in intensity should be substantially equal to zero. In case the patterns are displaced relative to each other, as e.g. illustrated in FIG. 7b, a difference in intensity can be noticed between the +1 reflected order, indicated by the arrow 756 and the −1 reflected order, indicated by the arrow 758. Note that the length of the arrows as shown is indicative of the intensity of the reflected beam. Based on this difference, the relative displacement d between both patterns, this displacement characterizing the overlay between the layers 720 and 740, can be determined.

Figure 8:
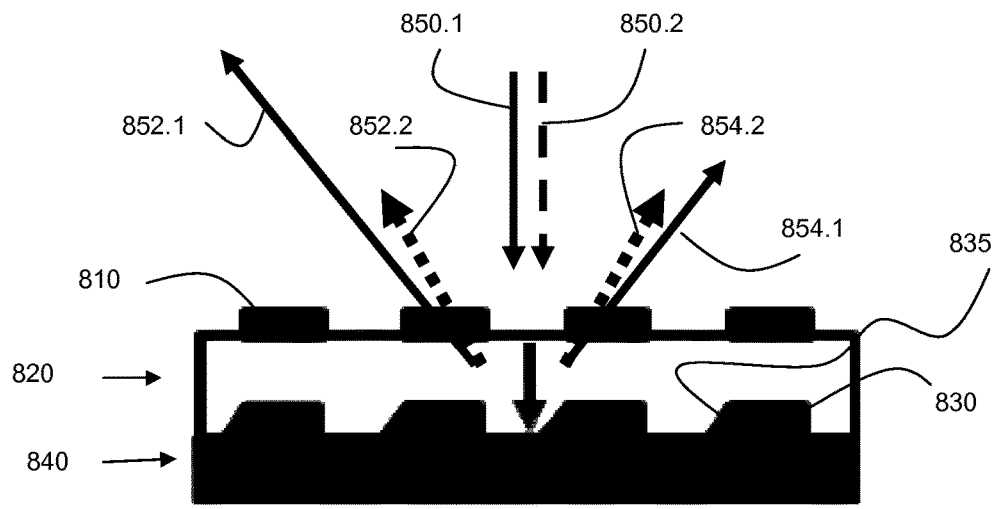
FIG. 8 schematically depicts an overlay measurement setup, whereby an overlay target is deformed.

FIG. 8 schematically illustrates a possible effect of a deformation of a mark on the overlay measurements. FIG. 8 schematically shows a cross-sectional view of an overlay mark on a substrate 800, the overlay mark comprising a first pattern 810 on a top layer 820 of the substrate 800 and a second pattern 830 on a lower layer 840 of the substrate 800, whereby the second pattern 830 is no longer symmetrical but has some type of deformation. In the embodiment as shown, one of the side walls of the second pattern 830 has a slanted surface 835 or side wall similar to the alignment mark 400 shown in FIG. 4 (b). Note that other types of deformations of the overlay marks may occur as well and affect the overlay measurement, e.g. other types of deformations as shown in FIG. 4. It may also be pointed out that the deformations affecting the overlay measurements may either occur in the top layer 820, in the lower layer 840 or both. FIG. 8 further shows the application of two measurement beam 850.1 and 850.2, e.g. measurement beams having a different measurement characteristic or parameter $\lambda$, and the +1 and −1 reflected orders for both measurement beams. More specifically, reflected beam 852.1 represents the +1 order reflected beam from measurement beam 850.1, reflected beam 854.1 represents the −1 order reflected beam from measurement beam 850.1, while reflected beam 852.2 represents the +1 order reflected beam from measurement beam 850.2 and reflected beam 854.2 represents the −1 order reflected beam from measurement beam 850.2.

Upon inspection of the reflected beams as indicated, one can notice a difference in intensity (indicated by the length of the arrows in the Figure) between the +1 order 852.1 and the −1 order 854.1 of the measurement beam 850.1, despite the fact that the first and second pattern 810, 830 are substantially aligned. At the same time, there is substantially no difference in intensity (indicated by the length of the arrows in the Figure) between the +1 order 852.2 and the −1 order 854.2 of the measurement beam 850.2. As such, one can conclude that the measurement beam 850.2 is insensitive to the deformation 835 as depicted, whereas the deformation 835 affects the measurement using the measurement beam 850.1. As such, when an overlay measurement would be conducted, using only measurement beam 850.1, this would result in an erroneous determination of the overlay between the patterns 830 and 810.

In an embodiment, the overlay measurement system may be configured to sequentially project different overlay measurement beams (i.e. beams having different characteristics or parameters $\lambda_1, \lambda_2, \lambda_3, \ldots \lambda_i$) onto a particular position on a substrate, provided with an overlay mark, to determine an overlay measurement result.

In another embodiment, a plurality of different overlay measurement beams may be combined into one measurement beam having different characteristics or parameters $\lambda_1, \lambda_2, \lambda_3, \ldots \lambda_i$ that is projected onto the substrate to determine the overlay measurement results. In such embodiment, it may be advantageous to arrange for the reflected beams off of the substrate to arrive at the detection system at different instances. In order to realize this, use can e.g. be made of a dispersive fiber as e.g. described in U.S. Pat. No. 9,046,385, incorporated herein by reference. Alternatively, the reflected measurement beams, including a plurality of different reflected measurement beams off of the substrate, may be provided to one or more filters to separate the different reflected measurement beams and assess the overlay. Within the meaning of the present invention, different measurement parameters or characteristics $\lambda_1, \lambda_2, \lambda_3, \ldots \lambda_i$ as applied by the overlay measurement system include at least a difference in polarization or a difference in frequency or frequency content of a measurement beam or the measurement beams used.

In view of the above, it will be apparent to the skilled person that a value for the overlay OV, obtained by a measurement using a measurement characteristic $\lambda$ can be written as:

$$OV(\lambda) = OV_0 + OV^{error}(\lambda) \qquad (10)$$

Where:

$OV(\lambda)$=the overlay measurement result as derived from the measurement;

$OV_0$=the actual overlay value;

$OV^{error}(\lambda)$=the overlay error, i.e. the component or part of the overlay measurement which is not caused by an actual relative displacement of the overlay marks considered. The overlay error may e.g. be caused by a deformation of the overlay mark as discussed, but may also be caused by a variation in the stack of layers applied. As indicated the overlay error $OV^{error}(\lambda)$ is considered to depend (as illustrated in FIG. 8) on the applied measurement characteristic $\lambda$.

In particular, the measured overlay per overlay recipe $\lambda$ (recipe hereby being used in a similar manner as the above described alignment recipe, e.g. specifying wavelength and/or polarization of an applied measurement beam), $OV(\lambda)$, can be split in "true" or actual overlay, $OV_0$ which is independent on measurement recipe $\lambda$, and an overlay error, $OV^{error}(\lambda)$ which is nonzero when the target is deformed and is dependent on the applied measurement recipe $\lambda$ From equation (10), it follows that, when the difference between overlay measurements is considered, the true or actual overlay, $OV_0$ drops out:

$$OV(\lambda_1) - OV(\lambda_2) = OV^{col2col} = OV^{error}(\lambda_1) - OV^{error}(\lambda_2) = OV^{error,col2col} \qquad (11)$$

Where:

$\lambda_1, \lambda_2$=the applied measurement characteristics or parameters or recipes;

$OV^{col2col}$=being a short hand notation of the difference in overlay obtained when using different measurement parameters $\lambda$, also referred to as the color-to-color overlay difference when using different measurement parameters. (col2col can be considered as color-to-color, referring to an embodiment whereby the different values of the measurement parameter λ represent different wavelengths and thus different colors.);

$OV^{error,col2col}$=being a short hand notation for the difference in overlay error between measurements taken using different measurement characteristics, e.g. different colors.

Based on equation (11), one can thus conclude that $OV^{col2col}$ can be used to monitor the overlay mark asymmetry for different recipes $\lambda_1$, $\lambda_2$.

It can further be pointed out, as will also be clear from the above examples regarding the effects of alignment mark deformations, that overlay mark deformations or asymmetries are not merely random patterns of deformations. Rather, as these deformations are caused by various processes to which the substrates are subjected, the overlay mark or overlay target deformations of a substrate can be described as a combination of one or more distinct patterns. As already described above, with reference to the alignment mark deformation, each process to which a substrate is subjected may cause a deformation of the substrate as a whole, a deformation of the marks present on the substrate or both. These deformations as caused by particular processes may have a particular shape, as e.g. illustrated in FIG. 3. In the above given example on the alignment mark deformations, these particular shapes are determined using a principal component analysis, the shapes subsequently being referred to as 'eigenwafers'.

It can be pointed out that the overlay data of a set of substrates could be processed in a similar manner to arrive at a set of eigenwafers, representing particular deformations or deformation shapes, caused by different processing steps.

When such eigenwafers are determined, one can e.g. describe the overlay error as a linear weighted combination of such eigenwafers, more specifically:

$$OV^{error}(\lambda)=\alpha_1(\lambda)F_1+\alpha_2(\lambda)F_2+ \qquad (12)$$

Where:

$\alpha_1$, $\alpha_2$=recipe dependent weight factors;

$F_1$, $F_2$=particular deformations or deformation shapes representing distributions of overlay mark deformations over a substrate. The deformation shapes Fi as applied in equation (12) do not describe a deformation of a substrate as a whole, rather, they are 'target deformation fingerprints', i.e. fingerprints or distributions of the deformations.

In a similar manner, the difference in overlay between measurements using different characteristics or recipes λ may also be described as a linear weighted combination of the same deformation shapes, using different weight coefficients:

$$OV^{col2col}=OV^{error,col2col}=b_1F_1+b_2F_2+ \qquad (13)$$

Where:

b1, b2=weight coefficients which are different for each color-to-color combination, i.e. for each different combination of characteristics or recipes λ.

Rather than solving a set of equations as described with respect to the alignment mark deformations in order to arrive at the eigenwafers or deformation shapes and use these to determine the overlay error as given by equation (12), an alternative approach is proposed which does not require the determination of the deformation shapes $F_i$ of equations (12) and (13) Rather, when equations (11) and (13) are combined, the deformation shapes $F_i$ can be taken out of the equations and an overlay error for a particular recipe, i.e. the particular recipe as applied by the overlay measurement system and referred to as the Process-On-Record or POR can be written as a linear weighted combination of the color to color overlay difference values, provided that the number of measurement characteristics λ available is larger than the number of deformation shapes $F_i$. More specifically:

$$OV^{error}(POR)=c_1OV^{col2col_1}+c_2OV^{col2col_2}+ \qquad (14)$$

Where:

$OV^{error}(POR)$=the overlay error at the Process-On-Record recipe;

$OV^{col2col}_i$=the different color-to-color overlay differences or variations that are available using i different recipes or characteristics λ.

With respect to the color-to-color differences in overlay $OV^{col2col}_i$ or the overlay error $OV^{error, col2col}$, it is worth mentioning that there are different manners to define those.

A first manner to define the color-to-color overlay differences or variations is to apply equations similar to equation (11), i.e. by taking the difference in overlay measurements obtained using different recipes or characteristics λ.

When three characteristics λ1, λ2, λ3 would be available, one could thus determine, as the color-to-color overlay differences:

$$OV(\lambda_1)=OV(\lambda_2)=OV^{col2col_1}$$

$$OV(\lambda_2)=OV(\lambda_3)=OV^{col2col_2}$$

$$OV(\lambda_1)=OV(\lambda_3)=OV^{col2col_3} \qquad (15)$$

Alternatively, one could determine, as the color-to-color overlay differences, a color-to-average-color difference as the difference between the overlay measurements taken at the respective recipes and the average overlay measurement (referred to as colormeanOV) using the different recipes. This can be formulated as follows:

$$OV(\lambda_i) - colormeanOV = OV^{col2col_i} \qquad (16)$$

$$colormeanOV = \frac{1}{N_\lambda}\sum_i OV(\lambda_i)$$

Wherein $N_\lambda$ being the number of measurement characteristics used to perform the overlay measurements.

Considering equation (14) and considering that the color-to-color differences can be directly determined based on overlay measurements using different recipes (as indicated by equations (15) and (16)), one can acknowledge that the $OV^{error}(POR)$ can be determined when the coefficients c in equation (14) are known.

In an embodiment of the present invention, it is proposed to determine coefficients $c_1$, $c_2$, . . . using a training set of substrates or wafers. Further, it is proposed, in a similar manner as described above with respect to the alignment measurements, to determine the overlay error variation from substrate to substrate (s2s) using equation (14). In the training set of substrates, it is assumed that the s2s variation of measured overlay, i.e. the substrate-to-substrate overlay difference, is dominated by metrology inaccuracy, i.e., $$OV_{s2s}(\lambda)\approx OV_{s2s}^{error}(\lambda) \qquad (17)$$

Where:

$OV_{s2s}$=the difference in measured overlay between two substrates in the training set.

Using this assumption, eq. 14 can be re-written as:

$$OV_{s2s}=c_1OV_{s2s}^{col2col_1}+c_2OV_{s2s}^{col2col_2}+ \qquad (18)$$

Now since both $OV_{s2s}$ and $OV_{s2s}^{col2col}$ can be directly measured or determined from overlay measurements performed on the training set of substrates, coefficients $c_1$, $c_2$, . . . can be determined. In an embodiment of the present invention, the set of equations (18) for the training set of substrates is determined using linear regression.

Because, as is clear from equation (18), only the part of the overlay substrate-to-substrate variation that correlates to the substrate-to-substrate variation of the color-to-color differences is corrected, the assumption of equation 17 can be partially relaxed.

In an embodiment of the present invention, a method is thus proposed having the following steps:

For a training set of substrates, overlay measurements are performed, using different recipes or measurement characteristics k.

Using the overlay measurements, the overlay variation from substrate to substrate $OV_{s2s}$ can be determined and the substrate-to-substrate variation of the color-to-color overlay differences $OV_{s2s}^{col2col}$.

Using equation (18), one may then express the $OV_{s2s}$ as a weighted linear combination of the substrate-to-substrate variation of the color-to-color overlay differences $OV_{s2s}^{col2col}$ and solve the set of equations for the coefficients $c_1$, $c_2$.

When the weight coefficients are determined, they can be used to correct for the overlay error of a new substrate. Assuming that the same set of recipes is used to perform the overlay measurements on the new substrate, equation (18) enables to determine the substrate to substrate overlay error for the new substrate, using the substrate-to-substrate variation of the color-to-color differences $OV_{s2s}^{col2col}$, which can be determined from the measurements, and the coefficients $c_1$, $c_2$, . . . .

The measured overlay of the new substrate may then be corrected by subtracting the calculated error from the measured overlay. By doing so, the accuracy of the measured overlay may be improved. This corrected overlay, which is closer to the actual or true overlay $OV_0$, may then be used as feedback to the lithographic apparatus exposing the substrates.

With respect to the above, it may be pointed out that, wherever reference is made to substrate-to-substrate overlay differences or variations of the overlay as measured, these variations may either refer to measured differences from substrate to substrate or they may refer to variations relative to an average overlay as measured over the set of substrates, e.g. the set of training substrates. In that respect, $OV_{s2s}$ of a new substrate may thus refer to the difference between the measured overlay of the new substrate and the average overlay, e.g. over the set of training substrates.

Figure 9:
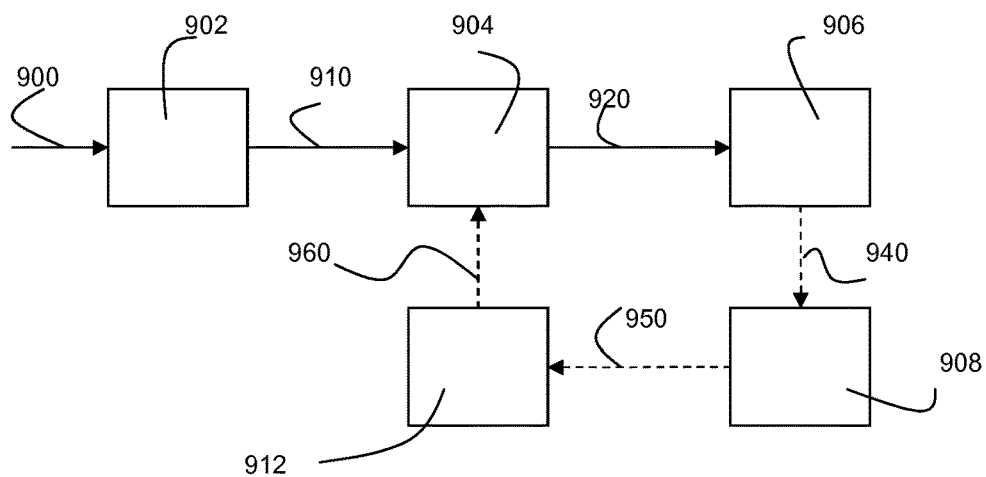
FIG. 9 schematically depicts a flow diagram of a method according to the present invention.

A possible flow of substrates and data when the described method is described is schematically shown in FIG. 9. FIG. 9 schematically shows a flow of substrates 900, e.g. training substrates or production substrates that are processed in a processing tool 902, e.g. an etcher or CMP. The substrates 910 as processed by the processing tool are subsequently processed by a scanner 904 or lithographic apparatus, to expose the substrates to a particular pattern. The substrates 920 as processed by the scanner may then be processed by a measurement system 906, e.g. a measurement system configured to measure the overlay using multiple different recipes or measurement characteristics. The overlay measurements 940 may then be provided to a computational platform 908, which may be incorporated in the measurement system 906 or be a dedicated, separate platform. In the computational platform 908, the overlay measurements may e.g. be used to determine, in case of training substrates, the coefficients $c_1$, $c_2$ or, in case of production substrates, the overlay error of the substrates, in order to correct the overlay. The corrected overlay of the substrates 950 may then e.g. be used in a control system 912 controlling the processing of the scanner 904, as indicate by the control data 960. Using the corrected overlay 950 as feedback, a feedback control of the scanner or lithographic apparatus 904 can be realized. The above described processing of overlay data of a set of substrates may advantageously be applied for one or more of the following purposes:

The proposed method may be used to select the most appropriate recipe or measurement characteristic. In this use case, one may e.g. determine the corrected overlay for the training set of substrates, and compares it to measurement results of all recipes. The recipe which gives measurement results that match closest to the corrected overlay can be used for future measurements. Once the preferred recipe has been established, one may e.g. only use the preferred recipe to determine the overlay of a substrate, e.g. using a measurement system 906 as shown in FIG. 9. Alternatively, one may choose to continue measuring the overlay with multiple different recipes in order to monitor the process stability.

In order to establish the weight coefficients $c_1$, $c_2$, use may e.g. be made of device overlay (e.g. measured by a SEM) or yield measurements (e.g. by electrical measurements) which represent overlay references. In case such overlay references are available on the training substrates, the assumption of equation (17) is no longer needed.

Instead of using a set of training substrates, dedicated calibration substrates may be used to determine the weight coefficients $c_1$, $c_2$. In such embodiment, one may e.g. intentionally subject calibration substrates to extreme settings of a processing tool, e.g. an etcher, in order to induce comparatively high process variations in the calibration substrates. Using such substrates may enable to more accurately derive the weight coefficients $c_1$, $c_2$.

In an embodiment, there is provided a method of characterizing a deformation of a plurality of S substrates, each comprising a plurality of m alignment marks, the method comprising the steps of:

performing for each substrate of the plurality of S substrates:
for each of the plurality of m alignment marks on the respective substrate of the plurality of S substrates the steps of:
measuring, for each of a plurality of n different alignment measurement parameters λ, a position of the respective alignment mark using the respective alignment measurement parameter so as to obtain n alignment mark position measurements for the respective alignment mark on the respective substrate;
determining, for each of the plurality of n different alignment measurement parameters λ, a positional deviation as the difference between the n alignment mark position measurements and a nominal alignment mark position, thereby obtaining n positional deviations for the respective alignment mark of the respective substrate;
grouping the positional deviations into a plurality of data sets;
determining an average data set:
subtracting the average data set from each of the plurality of data sets to obtain a plurality of variable data sets;
performing a blind source separation method such as a Principal Component Analysis on the variable data sets, thereby decomposing the variable data sets into a set of eigenwafers representing principal components of the variable data sets; and subdividing the set of eigenwafers into a set of mark deformation eigenwafers and a set of substrate deformation eigenwafers.

In an embodiment, the step of grouping the positional deviations comprises grouping the positional deviations per substrate S and per alignment measurement parameter into data sets, thereby obtaining S×n data sets, each data set comprising m positional deviations. In an embodiment, the step of grouping the positional deviations comprises grouping the positional deviations per substrate S into data sets, thereby obtaining S data sets, each data set comprising m×n positional deviations. In an embodiment, the step of determining the average data set comprises determining, for each of the plurality of alignment marks m on the plurality of S substrates and for each of the plurality of n different alignment measurement parameters $\lambda$, an average positional deviation a(m, n) as an average of the positional deviations of the alignment mark m of the set of alignment marks of the plurality of S substrates for each of the set of alignment marks. In an embodiment, the step of obtaining the variable data sets comprises subtracting, for each of the substrates of the plurality of substrates S, for each of the alignment mark position measurements, the respective average positional deviation a(m, n) to obtain, for each of the substrates the variable data set of m×n variable positional deviations v(m, n). In an embodiment, the step of subdividing the set of eigenwafers comprises mapping the set of eigenwafers onto one or more sets of variable positional deviations v(m, $\lambda$), thereby obtaining a weighted combination of the eigenwafers and assessing a correlation between the alignment measurement parameter and the weighted combination. In an embodiment, the step of subdividing the set of eigenwafers comprises performing a pattern recognition step on the eigenwafers, thereby comparing a pattern of the eigenwafers with one or more known deformation patterns. In an embodiment, the method further comprises: obtaining, for each of the plurality of S substrates, an overlay data set comprising overlay measurements at a plurality of overlay measurement positions for a previously exposed pattern on the plurality of S substrates, whereby an alignment process for the previously exposed pattern was performed in accordance with an alignment measurement parameter $\lambda_{rec}$; determining an average data set of the overlay data of the plurality of S substrates; and subtracting the average data set from each of the plurality of overlay data sets to obtain a plurality of variable overlay data sets, whereby the step of performing a blind source separation method includes constraining a weighted combination of the set of mark deformation eigenwafers according to the alignment measurement parameter $\lambda_{rec}$ to match the variable overlay data sets. In an embodiment, the method further comprises obtaining, for each of the plurality of S substrates, an overlay data set comprising overlay measurements at a plurality of overlay measurement positions for a previously exposed pattern on the plurality of S substrates, whereby an alignment process for the previously exposed pattern was performed in accordance with an alignment measurement parameter $\lambda_{rec}$; determining an average overlay data set of the overlay data of the plurality of S substrates; and subtracting the average overlay data set from each of the plurality of overlay data sets to obtain a plurality of variable overlay data sets, whereby the step of performing the blind source separation method comprises: combining the variable data sets and variable overlay data sets per substrate to obtained combined variable data sets and performing the blind source separation method on the combined variable data sets, thereby decomposing the combined variable data sets into a set of eigenwafers representing principal components of the combined variable data sets. In an embodiment, the step of subdividing the set of eigenwafers into a set of mark deformation eigenwafers and a set of substrate deformation eigenwafers comprises assessing a magnitude of a part of the eigenwafers associated with the variable overlay data sets.

In an embodiment, there is provided an alignment method for a lithographic apparatus, the method comprising: receiving a substrate by an alignment system in the lithographic apparatus; performing a plurality of alignment mark position measurements for one or more alignment marks and determining an alignment mark positional deviation as the difference between the alignment mark position measurement and a nominal alignment mark position; obtaining a set of eigenwafers by performing a method as described herein; determining a variable data set comprising variable positional deviations of the substrate based on the average positional deviations derived when performing a method as described herein; mapping the variable data set to the set of eigenwafers thereby obtaining an expression for the variable data set as a weighted combination of the mark deformation eigenwafers and of the substrate deformation eigenwafers; subtracting the weighted combination of the mark deformation eigenwafers from the variable positional deviations thereby obtaining a modified set of variable positional deviations of the substrate that are free of mark deformation induced effects; and performing an alignment of the substrate using the modified set of variable positional deviations.

In an embodiment, there is provided an alignment method for a lithographic apparatus, the method comprising: receiving a substrate by an alignment system in the lithographic apparatus; performing a plurality of alignment mark position measurements for one or more alignment marks; obtaining a set of eigenwafers by performing a method as described herein; determining a variable data set comprising variable positional deviations of the substrate based on the average positional deviations derived when performing a method as described herein; mapping the variable data set to the set of eigenwafers thereby obtaining an expression for the variable data set as a weighted combination of the mark deformation eigenwafers and of the substrate deformation eigenwafers; and performing an alignment of the substrate using the weighted combination of the substrate deformation eigenwafers as variable positional deviations.

In an embodiment, the alignment method further comprises applying the average data set as derived when performing a method as described herein to perform the alignment. In an embodiment, the alignment method further comprises determining a modified average data set based on the average positional deviations and the alignment mark positional deviations of the substrate and applying the modified average data set to perform the alignment. In an embodiment, the alignment method further comprises: obtaining, for each of the plurality of S substrates, an overlay data set comprising overlay measurements at a plurality of overlay measurement positions for a previously exposed pattern on the plurality of S substrates, whereby an alignment process for the previously exposed pattern was performed in accordance with an alignment measurement parameter $\lambda_{rec}$; and determining an average overlay data set of the overlay data of the plurality of S substrates; and applying the average overlay data set as a feedback correction prior to the alignment.

In an embodiment, there is provided an alignment system to perform a method as described herein. In an embodiment, the alignment system comprises an alignment projection system and an alignment detection system configured to perform the alignment mark position measurements, the alignment projection system being configured to project a plurality of alignment beams having n different alignment measurement parameters $\lambda$ onto a substrate.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and an alignment system as described herein.

In an embodiment, there is provided a device manufacturing method comprising: aligning a target portion of a substrate and a patterned beam of radiation by performing an alignment method as described herein; and projecting a patterned beam of radiation onto the target portion of the substrate.

In an embodiment, there is provided a method of characterizing an overlay measurement process using a plurality of S substrates, each comprising a plurality of m overlay targets, the method comprising:
performing for each substrate of the plurality of S substrates:
  for each of the plurality of m overlay targets on the respective substrate of the plurality of S substrates:
    deriving a set of overlay measurements by measuring, for each of a plurality of n different overlay measurement parameters $\lambda$, an overlay of the respective overlay target using the respective overlay measurement parameter so as to obtain n overlay target measurements for the respective overlay target on the respective substrate;
  determining, based on the set of overlay measurements:
    substrate-to-substrate overlay variations of the set of overlay measurements, $OV_{s2s}$,
    color-to-color overlay differences by combining overlay measurements obtained using different overlay measurement parameters $\lambda$, and
  substrate-to-substrate variations of the color-to-color differences $OV_{s2s}^{col2col}$;
  expressing the substrate-to-substrate overlay variations, $OV_{s2s}$, as a weighted linear combination of the substrate-to-substrate variations of the color-to-color differences $OV_{s2s}^{col2col}$ so as to obtain a set of equations having weight coefficients; and
  solving the set of equations for the weight coefficients.

In an embodiment, the substrate-to-substrate variations represent variations with respect to an average overlay of the plurality of S substrates, derived from the set of overlay measurements. In an embodiment, the color-to-color overlay differences are overlay differences with respect to an average overlay of a substrate of the plurality of S substrates. In an embodiment, the method further comprises obtaining, for the plurality of S substrates, a set of alignment measurements obtained using a plurality of different measurements characteristics; determining, based on the set of alignment measurements, substrate-to-substrate variations of color-to-color differences, $AL_{s2s}^{col2col}$; and expressing the substrate-to-substrate overlay variations, $OV_{s2s}$, as a weighted linear combination of the substrate-to-substrate variations of the color-to-color differences $OV_{s2s}^{col2col}$ and of the substrate-to-substrate variations of color-to-color differences, $AL_{s2s}^{col2col}$, so as to obtain the set of equations having weight coefficients. In an embodiment, the set of equations is solved using multiple linear regression.

In an embodiment, there is provided a method of determining an overlay error for a substrate, the method comprising: determining, for each of a plurality of m overlay targets on the substrate, an overlay of the respective overlay target using a plurality of n different overlay measurement parameters so as to obtain n overlay target measurements for the respective overlay target on the substrate; determining, for the substrate, substrate-to-substrate variations of color-to-color differences $OV_{s2s}^{col2col}$ based on the overlay target measurements; obtaining a set of weight coefficients using a method of characterizing an overlay measurement process as described herein; and determining a substrate-to-substrate overlay error for the substrate as a weighted combination, using the weight coefficients, of the substrate-to-substrate variations of color-to-color differences $OV_{s2s}^{col2col}$.

In an embodiment, there is provided an overlay measurement system comprising: an object table configured to support a substrate; an overlay measurement arrangement comprising a projection system and a detection system configured to perform overlay measurements, the projection system being configured to project a plurality of overlay measurement beams having n different alignment measurement parameters $\lambda$ onto a target location on the substrate; and a control system configured to control the overlay measurement arrangement to perform a method as described herein.

In an embodiment, there is provided a lithographic apparatus comprising an overlay measurement system as described herein.

In yet another use case, the model as applied to express the overlay error, or more specifically the substrate to substrate correctable variation of the overlay error, OVs2s, is further expanded by using alignment mark deformation in the model. It has been devised by the inventors that alignment mark deformation, as e.g. discussed above, may also cause a substrate to substrate correctable variation in the actual overlay $OV_0$. As such, one may e.g. correct alignment measurements by comparing them to the overlay substrate to substrate, e.g. using an optimal weighing of a set of measurement characteristics. This approach works well in case $OV_{s2s}^{error}$ is assumed to be zero. In practical cases, where $OV_{s2s}^{error}$ is not equal to zero, both the alignment mark deformation impact (which influences $OV_{0,s2s}$, and may be measured by $AL_{s2s}^{col2col}$) and the overlay target or mark deformation impact (which influences $OV_{s2s}^{error}$, and may be measured by $OV_{s2s}^{col2col}$) can be included in the modelling and equation 18 can be generalized to:

$$OV_{s2s}=c_1 OC_{s2s}^{col2col1}+c_2 OV_{s2s}^{col2col2}+\ldots+d_1 AL_{s2s}^{col2col1}+d_2 AL_{s2s}^{col2col2}+ \qquad (19)$$

Wherein:
$AL_{s2s}^{col2col}$=substrate-to-substrate variation of the color-to-color differences of the alignment measurements AL, which may be derived from the actual alignment measurements, using a plurality of recipes or measurement characteristics, in a similar manner as described above for the overlay measurements.

In equation (19), coefficients $d_1, d_2, \ldots$ are to be used for correcting the alignment mark deformation impact while coefficients $c_1, c_2, \ldots$ are to be used for correcting the overlay target deformation impact.

Using both overlay and alignment measurement of a set of training substrates, the coefficients $d_1, d_2$, and coefficients $c_1, c_2$, may be determined. In this respect, it may be pointed out, that such extended modelling performs best when $AL_{s2s}^{col2col}$ and $OV_{s2s}^{col2col}$ are independent on each other. In practice this is the case when indirect align is used. Even in the case of direct alignment, due to different design in alignment mark and overlay targets or marks, the processing effects on the marks may be different.

In addition to the use of color-to-color differences observed in overlay or alignment measurements, intensity asymmetry measurements of different measurement characteristics, e.g. obtained from an online metrology sensor in a lithographic apparatus or an offline metrology system) may be used to characterize the substrate to substrate overlay error.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of characterizing a deformation of a plurality of S substrates, each substrate comprising a plurality of m alignment marks, the method comprising:
    performing for each substrate of the plurality of S substrates:
        for each of the plurality of m alignment marks on the respective substrate of the plurality of S substrates:
            measuring, for each of a plurality of n different alignment measurement parameters λ, a position of the respective alignment mark using the respective alignment measurement parameter so as to obtain n alignment mark position measurements for the respective alignment mark on the respective substrate; and
            determining, for each of the plurality of n different alignment measurement parameters λ, a positional deviation as the difference between the n alignment mark position measurements and a nominal alignment mark position, thereby obtaining n positional deviations for the respective alignment mark of the respective substrate;
    grouping the positional deviations into a plurality of data sets;
    determining an average data set;
    subtracting the average data set from each of the plurality of data sets to obtain a plurality of variable data sets;
    performing a blind source separation method on the variable data sets, thereby decomposing the variable data sets into a set of eigenwafers representing principal components of the variable data sets; and
    subdividing the set of eigenwafers into a set of mark deformation eigenwafers and a set of substrate deformation eigenwafers.

2. The method according to claim 1, wherein grouping the positional deviations comprises grouping the positional deviations per substrate S and per alignment measurement parameter into data sets, thereby obtaining S×n data sets, each data set comprising m positional deviations.

3. The method according to claim 1, wherein grouping the positional deviations comprises grouping the positional deviations per substrate S into data sets, thereby obtaining S data sets, each data set comprising m×n positional deviations.

4. The method according to claim 3, further comprising:
    obtaining, for each of the plurality of S substrates, an overlay data set comprising overlay measurements at a plurality of overlay measurement positions for a previously exposed pattern on the plurality of S substrates, wherein an alignment process for the previously exposed pattern was performed in accordance with an alignment measurement parameter $\lambda_{rec}$;
    determining an average overlay data set of the overlay data of the plurality of S substrates; and
    subtracting the average overlay data set from each of the plurality of overlay data sets to obtain a plurality of variable overlay data sets,
    wherein performing the blind source separation method comprises combining the variable data sets and variable overlay data sets per substrate to obtained combined variable data sets and performing the blind source separation method on the combined variable data sets, thereby decomposing the combined variable data sets into a set of eigenwafers representing principal components of the combined variable data sets.

5. The method according to claim 1, wherein determining the average data set comprises determining, for each of the plurality of alignment marks m on the plurality of S substrates and for each of the plurality of n different alignment measurement parameters λ, an average positional deviation a(m, n) as an average of the positional deviations of the alignment mark m of the set of alignment marks of the plurality of S substrates for each of the sets of alignment marks.

6. The method according to claim 1, wherein subdividing the set of eigenwafers comprises performing a pattern recognition step on the eigenwafers, thereby comparing a pattern of the eigenwafers with one or more known deformation patterns.

7. The method according to claim 1, further comprising:
obtaining, for each of the plurality of S substrates, an overlay data set comprising overlay measurements at a plurality of overlay measurement positions for a previously exposed pattern on the plurality of S substrates, wherein an alignment process for the previously exposed pattern was performed in accordance with an alignment measurement parameter $\lambda_{rec}$;
determining an average data set of the overlay data of the plurality of S substrates; and
subtracting the average data set from each of the plurality of overlay data sets to obtain a plurality of variable overlay data sets,
wherein performing the blind source separation method includes constraining a weighted combination of the set of mark deformation eigenwafers according to the rec to alignment measurement parameter $\lambda_{rec}$ to match the variable overlay data sets.

8. An alignment method for a lithographic apparatus, the method comprising:
receiving a substrate by an alignment system;
performing a plurality of alignment mark position measurements for one or more alignment marks and determining an alignment mark positional deviation as the difference between the alignment mark position measurement and a nominal alignment mark position;
obtaining a set of eigenwafers by performing the method according to claim 1;
determining a variable data set comprising variable positional deviations of the substrate based on the average positional deviations derived when performing the method according to claim 1;
mapping the variable data set to the set of eigenwafers to obtain an expression for the variable data set as a weighted combination of the mark deformation eigenwafers and of the substrate deformation eigenwafers;
subtracting the weighted combination of the mark deformation eigenwafers from the variable positional deviations to obtain a modified set of variable positional deviations of the substrate that are free of mark deformation induced effects; and
performing an alignment of the substrate for the lithographic apparatus using the modified set of variable positional deviations.

9. The method according to claim 8, further comprising:
obtaining, for each of the plurality of S substrates, an overlay data set comprising overlay measurements at a plurality of overlay measurement positions for a previously exposed pattern on the plurality of S substrates, wherein an alignment process for the previously exposed pattern was performed in accordance with an alignment measurement parameter $\lambda_{rec}$;
determining an average overlay data set of the overlay data of the plurality of S substrates; and
applying the average overlay data set as a feedback correction prior to the alignment.

10. An alignment method for a lithographic apparatus, the method comprising:
receiving a substrate by an alignment system;
performing a plurality of alignment mark position measurements for one or more alignment marks obtaining a set of eigenwafers by performing the method according to claim 1;
determining a variable data set comprising variable positional deviations of the substrate based on the average positional deviations derived when performing the method according to claim 1;
mapping the variable data set to the set of eigenwafers to obtain an expression for the variable data set as a weighted combination of the mark deformation eigenwafers and of the substrate deformation eigenwafers; and
performing an alignment of the substrate for the lithographic apparatus using the weighted combination of the substrate deformation eigenwafers as variable positional deviations.

11. An alignment system comprising:
an alignment measurement apparatus configured to measure an alignment mark;
a processor system, controller or computer; and
a non-transitory computer-readable medium having instructions therein, the instructions, when executed, are configured to cause the processor system, controller or computer to cause performance of the method according to claim 8 using the alignment measurement apparatus.

12. The alignment system according to claim 11, wherein the alignment measurement apparatus comprises an alignment projection system and an alignment detector, the alignment projection system configured to project a plurality of alignment radiation beams having n different alignment measurement parameters λ onto a substrate and the alignment detector configured to measure alignment beam radiation redirected by the substrate for alignment mark position measurement.

13. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate, and
the alignment system according to claim 11, the alignment system configured to measure an alignment mark of the substrate and/or the substrate table.

14. A method of characterizing an overlay measurement process using a plurality of S substrates, each comprising a plurality of m overlay targets, the method comprising:
performing for each substrate of the plurality of S substrates:
for each of the plurality of m overlay targets on the respective substrate of the plurality of S substrates:
deriving a set of overlay measurements by measuring, for each of a plurality of n different overlay measurement parameters λ, an overlay of the respective overlay target using the respective overlay measurement parameter so as to obtain n overlay target measurements for the respective overlay target on the respective substrate;

determining, based on the set of overlay measurements:
substrate-to-substrate overlay variations of the set of overlay measurements, $OV_{s2s}$,
color-to-color overlay differences by combining overlay measurements obtained using different overlay measurement parameters $\lambda$, and
substrate-to-substrate variations of the color-to-color differences $OV_{s2s}^{col2col}$;

expressing the substrate-to-substrate overlay variations, $OV_{s2s}$, as a weighted linear combination of the substrate-to-substrate variations of the color-to-color differences $OV_{s2s}^{col2col}$ so as to obtain a set of equations having weight coefficients; and solving the set of equations for the weight coefficients.

15. The method according to claim 14, wherein the substrate-to-substrate variations represent variations with respect to an average overlay of the plurality of S substrates, derived from the set of overlay measurements.

16. The method according to claim 14, wherein the color-to-color overlay differences are overlay differences with respect to an average overlay of a substrate of the plurality of S substrates.

17. The method according to claim 14, further comprising:
obtaining, for the plurality of S substrates, a set of alignment measurements obtained using a plurality of different measurements characteristics;
determining, based on the set of alignment measurements, substrate-to-substrate variations of color-to-color differences, $AL_{s2s}^{col2col}$;
expressing the substrate-to-substrate overlay variations, $OV_{s2s}$, as a weighted linear combination of the substrate-to-substrate variations of the color-to-color differences $OV_{s2s}^{col2col}$ and of the substrate-to-substrate variations of color-to-color differences, $AL_{s2s}^{col2col}$, so as to obtain the set of equations having weight coefficients.

18. A method of determining an overlay error for a substrate, the method comprising:
determining, for each of a plurality of m overlay targets on the substrate, an overlay of the respective overlay target using a plurality of n different overlay measurement parameters so as to obtain n overlay target measurements for the respective overlay target on the substrate;
determining, for the substrate, substrate-to-substrate variations of color-to-color differences $OV_{s2s}^{col2col}$ based on the overlay target measurements;
obtaining a set of weight coefficients using the method according to claim 14; and
determining a substrate-to-substrate overlay error for the substrate as a weighted combination, using the weight coefficients, of the substrate-to-substrate variations of color-to-color differences $OV_{s2s}^{col2col}$.

19. An overlay measurement system comprising:
an object table configured to support a substrate;
an overlay measurement arrangement comprising a projection system and a detector, the projection system configured to project a plurality of overlay measurement radiation beams having n different overlay measurement parameters onto a target location on the substrate and the detector configured to measure overlay measurement beam radiation redirected by the substrate for overlay measurement; and
a processor system, computer or controller configured to control the overlay measurement arrangement to perform the method according to claim 14.

20. A lithographic apparatus comprising:
a pattern transfer system configured to transfer a pattern onto a substrate; and
the overlay measurement system according to claim 19 configured to measure the substrate.

* * * * *